US012381536B2

(12) United States Patent
Nozoe et al.

(10) Patent No.: US 12,381,536 B2
(45) Date of Patent: Aug. 5, 2025

(54) ELASTIC WAVE RESONATOR, ELASTIC WAVE FILTER, DEMULTIPLEXER, AND COMMUNICATION APPARATUS

(71) Applicant: KYOCERA Corporation, Kyoto (JP)

(72) Inventors: Soichiro Nozoe, Kyoto (JP); Tetsuya Kishino, Kyoto (JP); Naofumi Kasamatsu, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 410 days.

(21) Appl. No.: 17/909,430

(22) PCT Filed: Feb. 24, 2021

(86) PCT No.: PCT/JP2021/006850
§ 371 (c)(1),
(2) Date: Sep. 5, 2022

(87) PCT Pub. No.: WO2021/177108
PCT Pub. Date: Sep. 10, 2021

(65) Prior Publication Data
US 2023/0223925 A1 Jul. 13, 2023

(30) Foreign Application Priority Data

Mar. 6, 2020 (JP) ................................ 2020-039361
Jun. 26, 2020 (JP) ................................ 2020-110832

(51) Int. Cl.
*H03H 9/25* (2006.01)
*H03H 9/145* (2006.01)
*H03H 9/64* (2006.01)

(52) U.S. Cl.
CPC .............. *H03H 9/25* (2013.01); *H03H 9/145* (2013.01); *H03H 9/6483* (2013.01)

(58) Field of Classification Search
CPC ........ H03H 9/25; H03H 9/145; H03H 9/6483; H03H 9/14582; H03H 9/02574
(Continued)

(56) References Cited

U.S. PATENT DOCUMENTS 8,294,330 B1  10/2012  Abbott et al.
2007/0069837 A1  3/2007  Nishimura et al.
(Continued)

FOREIGN PATENT DOCUMENTS

JP  S63-135010 A  6/1988
JP  2018-137517 A  8/2018
(Continued)

*Primary Examiner* — Jorge L Salazar, Jr.
(74) *Attorney, Agent, or Firm* — Procopio, Cory, Hargreaves & Savitch LLP

(57) ABSTRACT

The strength of a spurious signal is reduced while maintaining the uniformity of a resonant frequency in an identical elastic wave resonator. An elastic wave resonator (4) includes a piezoelectric body (6), and a plurality of electrode fingers (14, 22) located on the piezoelectric body and arranged in a propagation direction (TD) of an elastic wave. A region in which the plurality of electrode fingers are located includes a first region (24A) and a second region (24B) in a plan view. The plurality of electrode fingers include a first electrode finger group (14A) located in the first region and a second electrode finger group (14B) located in the second region, and a pitch (PA) of the first electrode finger group is different from a pitch (PB) of the second electrode finger group. The first region and the second region have frequency effective-characteristics acting in a direction to cancel out effects on a higher resonant or antiresonant frequency and a lower resonant or antiresonant frequency brought about by a magnitude correlation between the pitches of the first and second electrode finger groups.

18 Claims, 29 Drawing Sheets

(58) Field of Classification Search
USPC .................................................. 333/193–196
See application file for complete search history.

(56) References Cited

U.S. PATENT DOCUMENTS

| 2010/0102669 A1* | 4/2010 | Yamanaka ......... H03H 9/14547 |
| | | 310/313 D |
| 2018/0026605 A1 | 1/2018 | Ito et al. |
| 2020/0295730 A1 | 9/2020 | Nagatomo et al. |

FOREIGN PATENT DOCUMENTS

| WO | 2005/050837 A1 | 6/2005 |
| WO | 2016/121818 A1 | 8/2016 |
| WO | 2019/111664 A1 | 6/2019 |

* cited by examiner

ELASTIC WAVE RESONATOR, ELASTIC WAVE FILTER, DEMULTIPLEXER, AND COMMUNICATION APPARATUS

TECHNICAL FIELD

The present invention relates to elastic wave devices.

BACKGROUND OF INVENTION

Known Literature 1 describes an elastic wave filter including a plurality of interdigital transducers having a certain specific resonant frequency on a piezoelectric substrate.

CITATION LIST

Patent Literature

Patent Document 1: WO 2005/050837

SUMMARY

Technical Problem

In the elastic wave filter in the past described in Patent Document 1, there arises a problem that a spurious signal that oscillates at a frequency different from a resonant frequency of the main resonance is generated.

Solution to Problem

An elastic wave resonator according to an aspect of the present disclosure includes a piezoelectric body, and a plurality of electrode fingers located on the piezoelectric body and arranged in a propagation direction of an elastic wave. A region in which the plurality of electrode fingers are located includes a first region and a second region in a plan view, the plurality of electrode fingers include a first electrode finger group located in the first region, and a second electrode finger group located in the second region, a pitch of the first electrode finger group is different from a pitch of the second electrode finger group, and the first region and the second region have frequency effective-characteristics acting in a direction to cancel out effects on a higher resonant or antiresonant frequency and a lower resonant or antiresonant frequency brought about by a magnitude correlation between the pitches of the first and second electrode finger groups.

Advantageous Effects of Invention

According to the present disclosure, the strength of a spurious signal is reduced while maintaining the uniformity of a resonant frequency or antiresonant frequency in an identical elastic wave resonator.

DESCRIPTION OF EMBODIMENTS

First Embodiment

Figure 1:
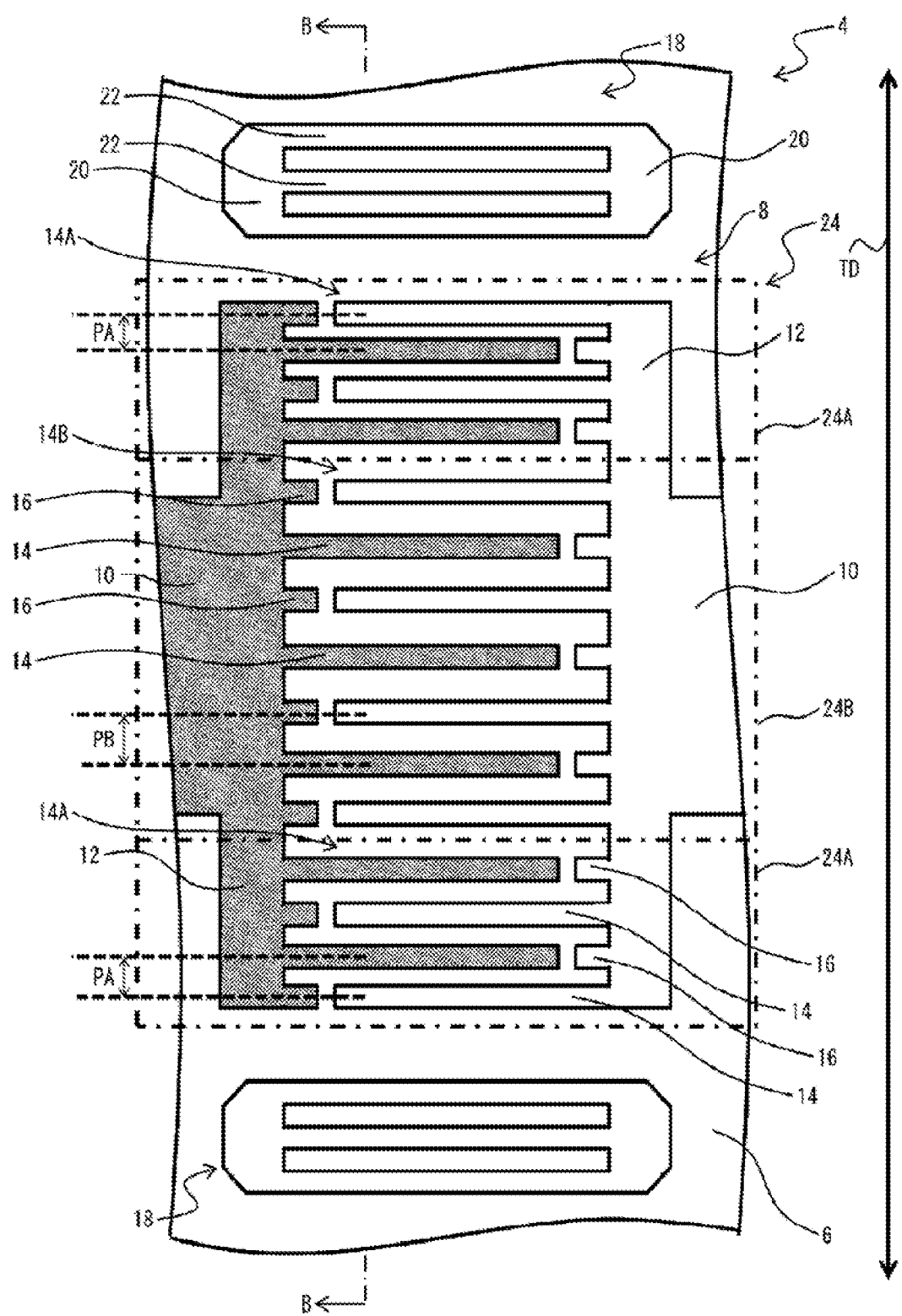
FIG. 1 is a schematic plan view of an elastic wave resonator according to a first embodiment of the present disclosure.

Embodiments according to the present disclosure will be described below with reference to the drawings. Note that the drawings used in the following description are schematic diagrams, and the dimension ratio of each member in the drawings is not strictly represented.

Configuration of Resonator

An elastic wave filter according to the present embodiment includes at least one elastic wave resonator. For example, the elastic wave filter constitutes a ladder filter by connecting a plurality of the elastic wave resonators in a ladder form. The elastic wave filter according to the present embodiment may include the plurality of elastic wave resonators in parallel in a direction orthogonal to a propagation direction of elastic waves in each of the elastic wave resonators.

Figure 2:
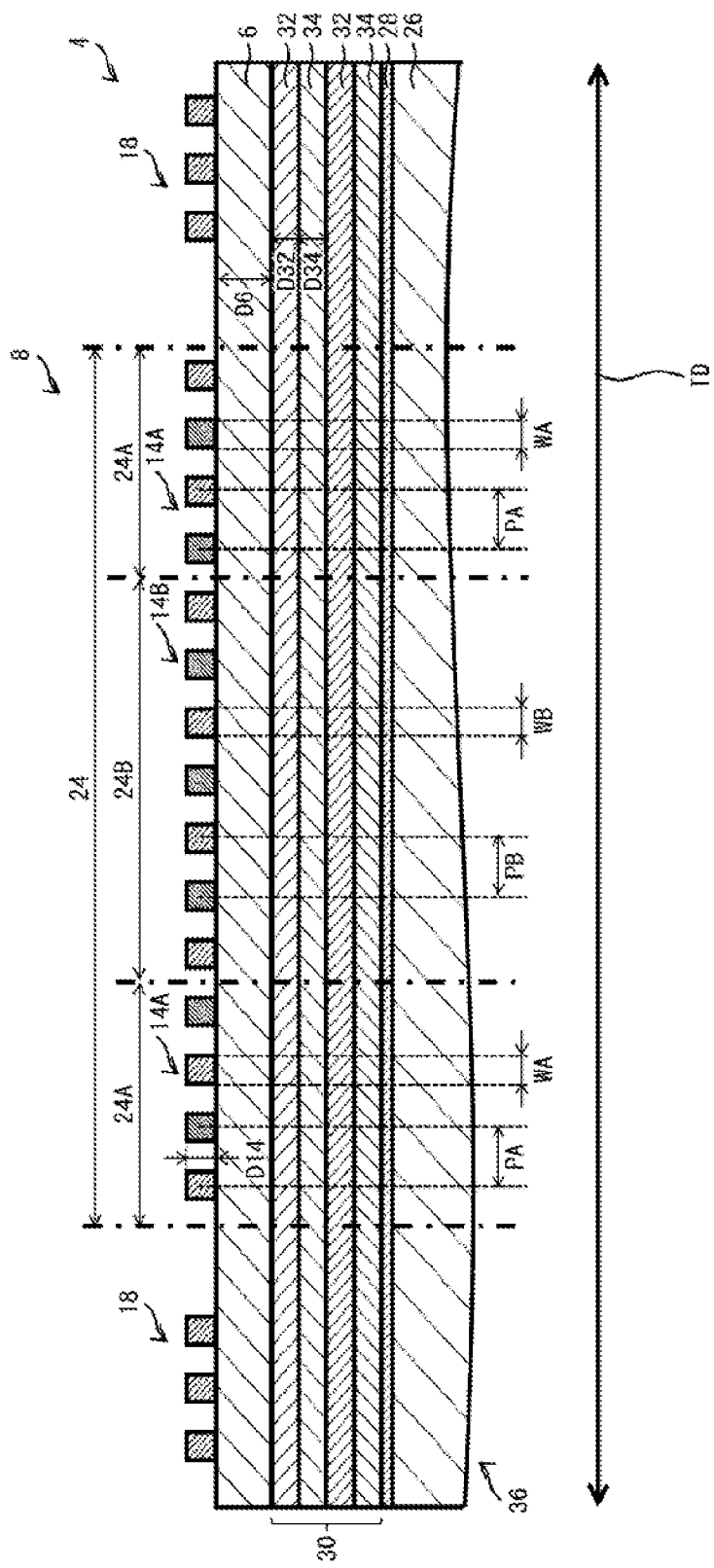
FIG. 2 is a schematic cross-sectional view of an elastic wave resonator according to the first embodiment of the present disclosure.

Hereinafter, an elastic wave resonator 4 according to the present embodiment will be described in more detail with reference to FIGS. 1 and 2. FIG. 1 is a schematic plan view of the elastic wave resonator 4 according to the present embodiment. FIG. 2 is a schematic cross-sectional view of the elastic wave resonator 4 according to the present embodiment, and is a cross-sectional view taken along an arrow line B-B in FIG. 1. In the present specification, a propagation direction TD of elastic waves in the elastic wave resonator 4 is defined as an up-down direction toward the face of the paper surface in plan view of the elastic wave resonator 4 including FIG. 1, and is defined as a right-left direction toward the paper surface in the cross-sectional view of the elastic wave resonator 4 including FIG. 2. In the present specification, in the cross-sectional views including FIG. 2 of the elastic wave resonator 4, only the members in the cross section are illustrated, while the members deeper than the cross section are not illustrated for the sake of simplicity of the drawings.

As illustrated in FIGS. 1 and 2, the elastic wave resonator 4 according to the present embodiment at least includes a piezoelectric body 6 and an IDT electrode 8 on the piezoelectric body 6. In the cross-sectional views of the elastic wave resonator 4 of the present specification, including FIG. 2, the IDT electrode 8 is illustrated as being located on the top side with respect to the piezoelectric body 6 when viewed in a direction facing the paper surface.

The piezoelectric body 6 is made of a piezoelectric material, and may use, for example, a single crystal of lithium tantalate (hereinafter, also referred to as LT), lithium niobate or the like. When a voltage is applied to an electrically conductive layer including the IDT electrode 8 described later in the elastic wave resonator 4, an elastic wave propagating through the piezoelectric body 6 in the propagation direction TD is excited. In the present embodiment, the piezoelectric body 6 may have a constant thickness D6 as illustrated in FIG. 2. In the present specification, the expression "thickness does not necessarily mean that the thickness is strictly constant, and a small amount of variation in the thickness is allowed within a range where the characteristics of the elastic wave propagating through the piezoelectric body 6 are not significantly affected.

Details of IDT Electrode and Reflector

The IDT electrode 8 includes a pair of comb electrodes 10. In the present specification, in the plan views including FIG. 1 of the elastic wave resonator 4, one of the paired comb electrodes 10 is hatched to improve visibility. Each of the comb electrodes 10 includes, for example, a bus bar 12, a plurality of electrode fingers 14 each extending from the bus bars 12, and a plurality of dummy electrodes 16 projecting from the bus bars 12 between each of the plurality of electrode fingers 14. The pair of comb electrodes 10 are arranged in such a manner that the plurality of electrode fingers 14 intermesh with each other.

The bus bar 12 has a substantially constant width and is formed substantially along the propagation direction TD. The pair of bus bars 12 face each other in a direction substantially orthogonal to the propagation direction TD. The width of each of the bus bars 12 may be changed or the bus bars 12 may be formed inclined relative to the propagation direction TD, to the extent that the elastic wave propagating through the piezoelectric body 6 is not significantly affected.

Each of the electrode fingers 14 is formed in an elongated shape substantially along the width direction of the bus bar 12. In each of the comb electrodes 10, each of the electrode fingers 14 is arranged in the propagation direction TD. The electrode fingers 14 extending from one of the paired bus bars 12 and the electrode fingers 14 extending from the other one of the paired bus bars 12 are alternately arranged in the propagation direction TD.

The number of electrode fingers 14 is not limited to the number illustrated in FIG. 1, and may be appropriately designed in accordance with the characteristics required for the elastic wave resonator 4. As illustrated in FIG. 1, the lengths of the electrode fingers 14 may be substantially constant, or the lengths may differ from each other in accordance with the position in the propagation direction TD, in other words, so-called apodization may be applied. Some of the electrode fingers 14 may be "thinned out" in part of the IDT electrode 8. To rephrase, the IDT electrode 8 may include a region where some of the electrode fingers 14 are not formed in a region where the IDT electrode 8 is formed.

Each dummy electrode 16 projects substantially along the width direction of the bus bar 12. The dummy electrodes 16 projecting from one of the bus bars 12 face the tips of the electrode fingers 14 extending from the other one of the bus bars 12 with a gap interposed therebetween in a direction orthogonal to the propagation direction TD. It is acceptable that the elastic wave resonator 4 according to the present embodiment does not include the dummy electrodes 16.

The elastic wave resonator 4 further includes a pair of reflectors 18 located at both ends with respect to the electrode fingers 14 in the propagation direction TD on the piezoelectric body 6. The reflector 18 includes a plurality of strip electrodes 22 extending from a pair of bus bars 20 facing each other. The reflector 18 may be in an electrically floating state, or a reference potential may be applied to the reflector 18. The IDT electrode 8 and the reflector 18 may be formed in the same layer or may be contained in the electrically conductive layer. The IDT electrode 8 and the reflector 18 are made of a metal material, and may be made of, for example, an alloy containing Al as a main ingredient. The number, shape, and the like of each of the strip electrodes 22 of the reflector 18 are not limited to the configuration illustrated in FIG. 1, and may be appropriately designed in accordance with the characteristics required for the elastic wave resonator 4 as in the case of the electrode fingers 14.

When simply referring to the term "electrode fingers" in the present specification, the "electrode fingers" include the plurality of electrode fingers 14 of the IDT electrode 8. When the elastic wave resonator 4 includes the reflector 18, the "electrode fingers" in the present specification may further include the plurality of strip electrodes 22 of the reflector 18.

Pitch of Electrode Fingers

In the elastic wave resonator 4 according to the present embodiment, as illustrated in FIGS. 1 and 2, the plurality of electrode fingers 14 of the IDT electrode 8 are located in an electrode finger placement region 24 in a plan view. In the present embodiment, the electrode finger placement region 24 includes at least one first region 24A and at least one second region 24B. The electrode fingers 14 include a first electrode finger group 14A located in the first region 24A and a second electrode finger group 14B located in the second region 24B.

In particular, in the present embodiment, the electrode finger placement region 24 may include at least one of the first region 24A or the second region 24B in a plural number. For example, as illustrated in FIG. 1, in the propagation direction TD, the electrode finger placement regions 24 symmetrically include the first regions 24A with respect to the second region 24B. In other words, the first regions 24A are located at both ends of the second region 24B in the propagation direction TD.

The plurality of electrode fingers 14 are each arranged with a certain pitch interposed therebetween. Among the elastic waves propagating through the piezoelectric body 6, the resonant frequency held by the elastic wave that is excited by the elastic wave resonator 4 depends on the pitch of the electrode fingers 14. In general, the resonant frequency held by the elastic wave that is excited by the elastic wave resonator 4 becomes higher as the pitch of the electrode fingers 14 is made smaller.

In the present specification, the term "resonant frequency" refers to a resonant frequency held by the elastic wave that is excited by the main resonance mode among the elastic waves excited by the elastic wave resonator 4, and does not refer to the frequency of the elastic wave excited by sub-resonance or a spurious mode.

In the present embodiment, a first pitch PA of the first electrode finger group 14A is different from a second pitch PB of the second electrode finger group 14B. Specifically, for example, in the present embodiment, the first pitch PA is shorter than the second pitch PB. For example, the first pitch PA is 0.708 µm, and the second pitch PB is 0.745 µm.

The thickness D6 of the piezoelectric body 6 is not particularly limited, and is about 0.4 to 1.2 times the size of any of the first pitch PA and the second pitch PB, for example, in the present embodiment. For example, the thickness D6 of the piezoelectric body 6 is approximately 0.28 µm to 0.9 µm.

The thickness D6 of the piezoelectric body 6 is preferably a thickness smaller than or equal to the first pitch PA in the first electrode finger group 14A, or smaller than or equal to the second pitch PB in the second electrode finger group 14B. This allows the resonant frequency to be higher by the elastic wave resonator 4 provided with the electrode fingers 14 having a relatively wide pitch.

Duty Ratio of Electrode Finger

The elastic wave resonator 4 according to the present embodiment has resonant frequency effective characteristics acting in a direction to cancel out effects on a higher resonant frequency and a lower resonant frequency brought about by a magnitude correlation between the first pitch PA and the second pitch PB. In other words, a difference in the resonant frequency between the first region 24A and the second region 24B in the elastic wave resonator 4 according to the present embodiment is smaller than an expected difference in the resonant frequency in an elastic wave resonator in the past, derived from a difference between the first pitch PA and the second pitch PB. In the present specification, the resonant frequency effective characteristics may be simply referred to as frequency effective characteristics.

In the present embodiment, the resonant frequency effective characteristics refer to a difference between a duty ratio of the electrode finger 14 in the first region 24A and a duty ratio of the electrode finger 14 in the second region 24B. The duty ratio of the electrode finger 14 is a value obtained by dividing the width of a certain one of the electrode fingers 14 by the pitch between the certain one of the electrode fingers 14 and one of the electrode fingers 14 adjacent thereto. In general, the resonant frequency held by the elastic wave that is excited by the elastic wave resonator 4 becomes higher as the duty ratio of the electrode finger 14 becomes smaller.

In the present embodiment, the duty ratio of the first electrode finger group 14A is different from the duty ratio of the second electrode finger group 14B. Specifically, in the present embodiment, the duty ratio of the first electrode finger group 14A is greater than the duty ratio of the second electrode finger group 14B. Thus, the difference in duty ratio between the first electrode finger group 14A and the second electrode finger group 14B acts in a direction to cancel out the difference between the resonant frequency in the first region 24A and the resonant frequency in the second region 24B generated due to the fact that the first pitch PA is shorter than the second pitch PB.

The duty ratios of the first electrode finger group 14A and the second electrode finger group 14B may be designed by appropriately designing a first width WA of each of the electrode fingers 14 included in the first electrode finger group 14A and a second width WB of each of the electrode fingers 14 included in the second electrode finger group 14B illustrated in FIG. 2.

For example, the duty ratio of the first electrode finger group 14A is 0.6, and the duty ratio of the second electrode finger group 14B is 0.3. As described above, when the first pitch PA is 0.708 μm and the second pitch PB is 0.745 μm, the first width WA is about 0.4248 μm and the second width WB is 0.2235 μm, for example.

In the present embodiment, a thickness D14 of each of the electrode fingers 14 may be the same in both the first region 24A and the second region 24B. The thickness D14 of the electrode finger 14 is, for example, approximately 0.16 times the size of any of the first pitch PA and the second pitch PB. The thickness of the strip electrode 22 of the reflector 18 may be identical to the thickness of the electrode finger 14.

Fixation Substrate

Returning to the description of each configuration of the elastic wave resonator 4, as illustrated in FIG. 2, the elastic wave resonator 4 further includes a support substrate 26 on the side opposite to the IDT electrode 8 relative to the piezoelectric body 6. In the present embodiment, the effect of the support substrate 26 on the characteristics of the elastic wave propagating through the piezoelectric body 6 is sufficiently small. Thus, the material and dimensions of the support substrate 26 may be appropriately designed. For example, the support substrate 26 may contain an insulation material, and may contain a resin or a ceramic. The thickness of the support substrate 26 is, for example, greater than the thickness D6 of the piezoelectric body 6. The linear expansion coefficient of the material of the support substrate 26 is preferably lower than the linear expansion coefficient of the piezoelectric body 6 in order to further reduce the effect on the characteristics of the elastic wave.

In addition, the elastic wave resonator 4 includes a reflective multilayer film 30 between the piezoelectric body 6 and the support substrate 26. The elastic wave resonator 4 may include a cohesion layer 28 between the reflective multilayer film 30 and the support substrate 26. A laminate body including the piezoelectric body 6, the support substrate 26, the cohesion layer 28, and the reflective multilayer film 30 may be referred to as a fixation substrate 36.

The cohesion layer 28 is a layer inserted in order to improve adhesiveness between the support substrate 26 and the reflective multilayer film 30, and the effect by the cohesion layer 28 on the characteristics of the elastic wave propagating through the piezoelectric body 6 is sufficiently small.

The reflective multilayer film 30 includes first layers 32 and second layers 34, these layers being alternately layered. The material of the first layer 32 has low acoustic impedance compared with the material of the second layer 34. As a result, at an interface between the first layer 32 and the second layer 34, the reflectance of the elastic wave increases, and therefore the leakage of the elastic wave propagating through the piezoelectric body 6 to the outside of the elastic wave filter is reduced.

For example, the first layer 32 is made of silicon dioxide (SiO$_2$). The second layer 34 is made of hafnium oxide (HfO$_2$), for example. In addition, the second layer 34 may be made of any of tantalum pentoxide (Ta$_2$O$_5$), zirconium dioxide (ZrO$_2$), titanium oxide (TiO$_2$), and magnesium oxide (MgO).

The reflective multilayer film 30 need only include at least one first layer 32 and at least one second layer 34, and the numbers of layers do not particularly matter. The total value of the numbers of layers of the first layers 32 and second layers 34 may be an odd number or may be an even number. Among the layers in the reflective multilayer film 30, the layer in contact with the piezoelectric body 6 is the first layer 32, and the layer in contact with the cohesion layer 28 may be any of the first layer 32 and the second layer 34.

For example, the reflective multilayer film 30 may include not less than three and not more than 12 layers of the first layers 32 and the second layers 34 in total. However, the reflective multilayer film 30 may include only one first layer 32 and only one second layer 34. The cohesion layer 28 may be formed also between the first layer 32 and the second layer 34 from the perspective of improving the adhesiveness of each layer of the reflective multilayer film 30 and suppressing diffusion of elastic waves in the reflective multilayer film 30.

As illustrated in FIG. 2, the first layers 32 may each have a constant thickness D32, and the second layers 34 may each have a constant thickness D34. The thickness D32 and the thickness D34 may be, for example, approximately 0.25 to 2 times the size of any of the first pitch PA and the second pitch PB.

Making Resonant Frequency Uniform

In the present embodiment, for example, the resonant frequency of the main resonance of the elastic wave propagating through the piezoelectric body 6 in the first region 24A is identical to the resonant frequency of the main resonance of the elastic wave propagating through the piezoelectric body 6 in the second region 24B. As a result, the frequency of the elastic wave excited in the piezoelectric body 6 is made uniform in the first region 24A and the second region 24B, and thus the characteristics of the elastic wave resonator 4 are improved.

In the present specification, the expression "frequency is identical" does not necessarily refer to the frequency being strictly identical. For example, the resonant frequencies of the main resonance of the elastic wave propagating through the piezoelectric body 6 in the first region 24A and in the second region 24B are allowed to slightly differ from each other within a range where the difference does not significantly affect the characteristics of the elastic wave resonator 4.

Specifically, as a numerical value for determining that "the resonant frequency in the first region 24A and the resonant frequency in the second region 24B are identical", a value (dfr) calculated in the following manner may be used: a difference between the resonant frequency in the first region 24A and the resonant frequency in the second region 24B is divided by the desired resonant frequency, and then the obtained value is multiplied by 100. For example, when dfr is in a range from −0.856 to 0.856, it may be said that "the resonant frequency in the first region 24A is identical to the resonant frequency in the second region 24B".

When the value of dfr satisfies the range described above, the generation of a spurious signal due to inclusion of the first region 24A and the second region 24B, in the frequency characteristics as the elastic wave resonator 4 can be suppressed. In the present embodiment, when the above-described range is satisfied, the absolute value of the difference in the resonant frequency between the first region 24A and the second region 24B is 50 MHz or less.

In a case where dfr is −1.028 or 1.028, the generation of the spurious signal has been confirmed. In this case, the absolute value of the difference in the resonant frequency between the first region 24A and the second region 24B corresponds to 60 MHz in the present embodiment.

Figure 3:
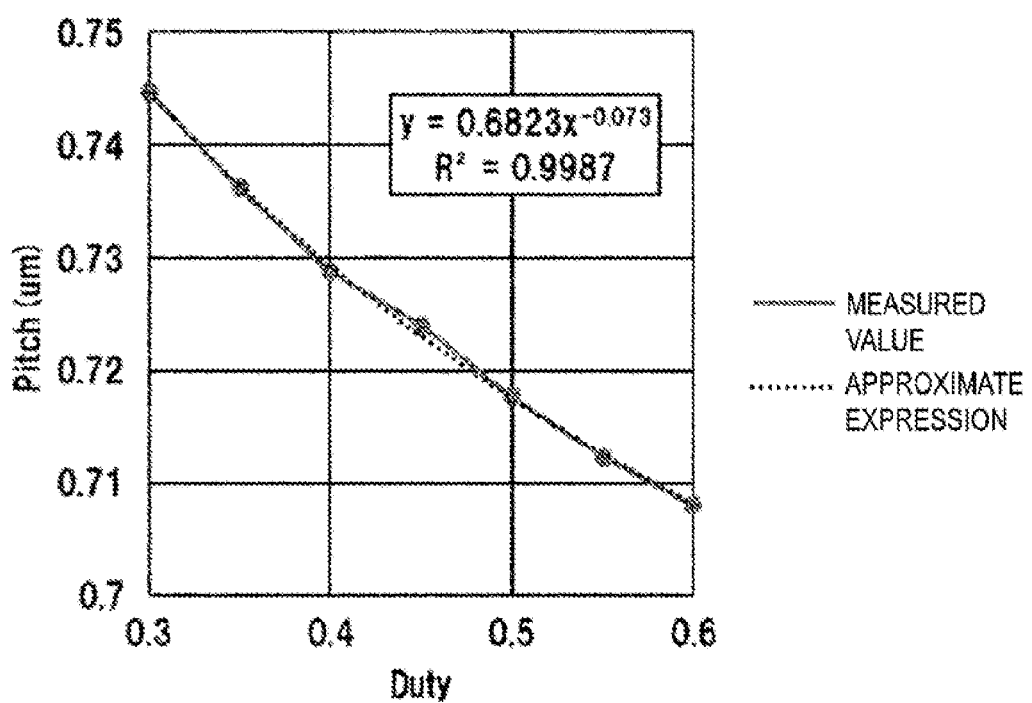
FIG. 3 is a graph indicating a relationship between a pitch and a duty ratio in a case where a resonant frequency is set to be constant in an elastic wave resonator according to the first embodiment of the present disclosure.

A technique for making the resonant frequencies in the first region 24A and the second region 24B uniform will be described in more detail with reference to FIG. 3. FIG. 3 is a graph depicting to what extent the duty ratio changes in response to the change of the pitch in an elastic wave resonator having an identical configuration to the elastic wave resonator 4 according to the present embodiment when the resonant frequency of the excited elastic wave is set to be constant.

In the graph of FIG. 3, the solid line represents a simulation value indicating to what extent the duty ratio changes in response to a change in pitch, and the dotted line represents an approximation expression of the pitch and duty ratio based on the simulation value. An expression that best fits the simulation value is appropriately selected for the approximation expression. For example, power approximation, logarithmic approximation, polynomial approximation, or the like may be selected as appropriate. In the above-described example, the approximation expression was obtained by power approximation because it was the most accurate approximation. In the graph of FIG. 3, the vertical axis represents pitch (units: μm), and the horizontal axis represents duty ratio.

When the pitch is denoted by y (units: μm) and the duty ratio is denoted by x, in the case where the resonant frequency of the excited elastic wave is set to be constant, a relational expression of the pitch and the duty ratio may be approximated by an expression of $y=0.6823 \times x^{(-0.073)}$. A total value R2 of the square of an error between the simulation value and the approximate expression was 0.9987.

As depicted in the graph of FIG. 3, in the case where the resonant frequency of the excited elastic wave is set to be constant, a relational expression indicating to what extent the duty ratio changes in response to the change of the pitch can be calculated. Thus, in the present embodiment, the duty ratio of the first electrode finger group 14A and the duty ratio of the second electrode finger group 14B may be calculated from the first pitch PA and the second pitch PB in order to make the resonant frequency of the first region 24A identical to the resonant frequency of the second region 24B.

Characteristics Change Due to Difference in Pitch and Duty Ratio

Figure 4:
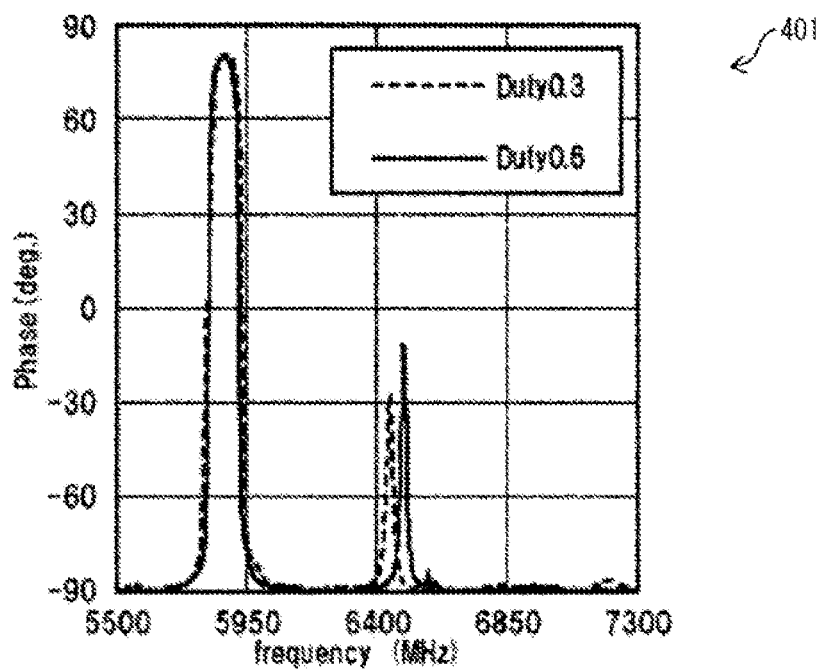
FIG. 4 includes graphs depicting a change in characteristics of an elastic wave resonator depending on a duty ratio according to the first embodiment of the present disclosure.
Figure 4:
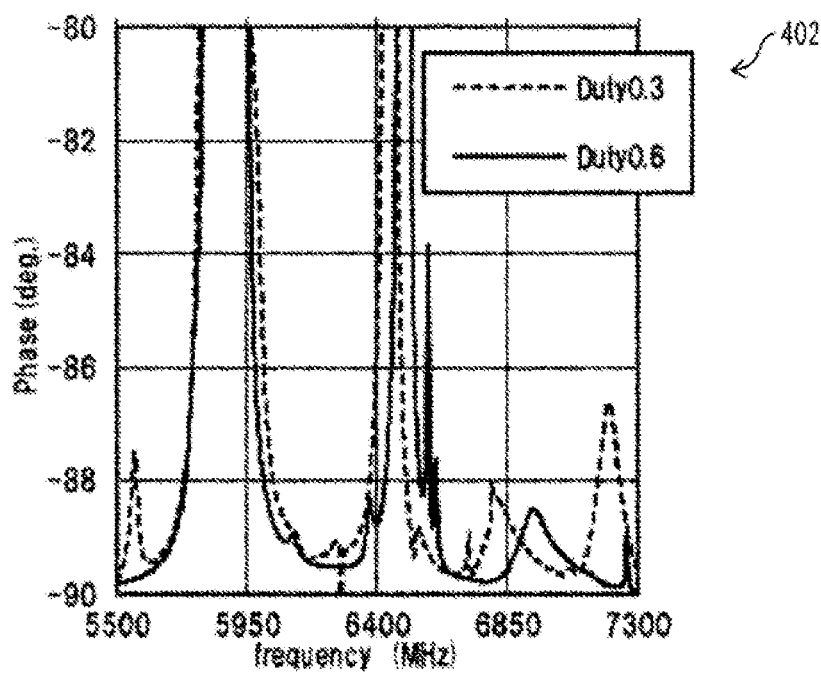

FIG. 4 includes graphs depicting characteristics of elastic waves excited in elastic wave resonators having an identical configuration to the elastic wave resonator 4 according to the present embodiment, and in each of the graphs, a phase of impedance at each frequency in the elastic wave resonator is depicted. In other words, the graphs in FIG. 4 are graphs each depicting the strength of the elastic wave oscillating in the elastic wave resonator at each frequency. In the graphs of FIG. 4, the vertical axis represents phase (units: deg), and the horizontal axis represents frequency (units: MHz).

In each of the graphs of FIG. 4, the solid line indicates a calculation result by simulation in an elastic wave resonator with the duty ratio of the electrode finger 14 being 0.6. In each of the graphs of FIG. 4, the dashed line indicates a calculation result by the simulation in an elastic wave resonator with the duty ratio of the electrode finger 14 being 0.3. The pitches of the electrode fingers 14 of the two elastic wave resonators respectively simulated in the graphs of FIG. 4 are determined to have identical resonant frequencies based on the relational expression represented in FIG. 3. Of the graphs in FIG. 4, graph 402 is a graph in which a part of graph 401 in a phase range from −90 degrees to −80 degrees is enlarged and depicted.

As is apparent from the graphs depicted in FIG. 4, even between the two elastic wave resonators having different pitches and duty ratios, the resonant frequency at which the phase of the impedance is highest remains almost unchanged. The resonant frequency and the antiresonant frequency were also confirmed by confirming the absolute value of the impedance, between the two elastic wave resonators having different pitches and duty ratios. In this case as well, it was confirmed that the resonant frequency and the antiresonant frequency were almost unchanged, between the two elastic wave resonators having different pitches and duty ratios.

However, as is prominently depicted in graph 402 of FIG. 4, the frequencies of spurious signals excited at other frequencies excluding the resonant frequency differ between the above-described two elastic wave resonators. These elastic waves excited at other frequencies excluding the resonant frequency include frequencies excited in the spurious mode.

Figure 5:
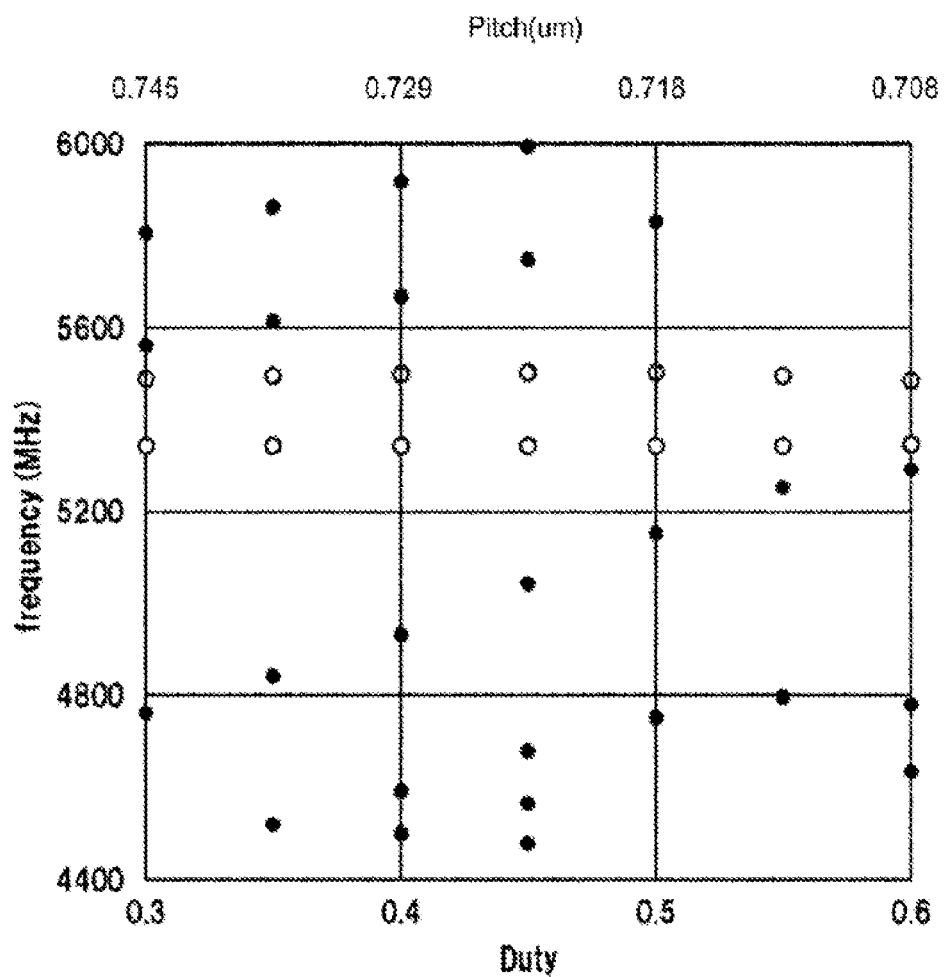
FIG. 5 is a graph indicating a relationship between a pitch and a duty ratio, and a frequency of an oscillating elastic wave in an elastic wave resonator according to the first embodiment of the present disclosure.

FIG. 5 is a graph showing that, in elastic wave resonators having an identical configuration to the elastic wave resonator 4 according to the present embodiment, each of the frequencies of the elastic waves excited by the elastic wave resonators is depicted in the case where the pitch and the duty ratio are changed so as to make the resonant frequency constant. In the graph of FIG. 5, the horizontal axis represents pitch (units: μm) and duty ratio, and the vertical axis represents frequency (units: MHz). In the graph of FIG. 5, the value of the pitch of the electrode fingers changes with the change in the duty ratio in accordance with the relational expression depicted in FIG. 3.

In the graph of FIG. 5, a white circle indicates a calculation result by the simulation of the frequency of the elastic wave excited in the main resonance mode and antiresonance mode excited by the elastic wave resonator. In the graph of FIG. 5, a black circle indicates a calculation result by the simulation of the frequency of the spurious signal excited in a mode other than the modes of the main resonance and antiresonance excited by the elastic wave resonator.

As indicated on the horizontal axis of FIG. 5, by changing the duty ratio and pitch of the electrode fingers, the frequency of the elastic wave excited in the main resonance mode and antiresonance mode excited by the elastic wave resonator becomes substantially constant. In FIG. 5, an elastic wave resonator with characteristics including a resonant frequency of main resonance near 5350 MHz and a resonant frequency of antiresonance near 5500 MHz is exemplified.

However, as depicted in FIG. 5, the frequency of the elastic wave excited in the spurious mode changes with the change in the duty ratio and pitch of the electrode fingers. This is because the frequency of the elastic wave excited in the spurious mode has a dependence on the change in the duty ratio and pitch of the electrode fingers different from the dependence of the frequency of the elastic wave excited in the main resonance mode and antiresonance mode.

Effect of Elastic Wave Resonator According to First Embodiment

The elastic wave resonator 4 according to the present embodiment includes the first electrode finger group 14A and the second electrode finger group 14B having mutually different pitches in the same resonator. On the other hand, the elastic wave resonator 4 has resonant frequency characteristics acting in a direction to cancel out effects on a higher resonant frequency and a lower resonant frequency caused by a difference in the pitch between the first electrode finger group 14A and the second electrode finger group 14B. In the present embodiment, the resonant frequency characteristics refer to a difference in the duty ratio between the first electrode finger group 14A and the second electrode finger group 14B. In other words, a difference in the resonant frequency caused by a difference in the pitch between the first electrode finger group 14A and the second electrode finger group 14B is reduced by the difference in the duty ratio between the first electrode finger group 14A and the second electrode finger group 14B.

Thus, the elastic wave resonator 4 includes the first electrode finger group 14A and the second electrode finger group 14B having mutually different pitches and duty ratios, and having a more reduced difference in the resonant frequency therebetween. This makes it possible to cause the frequency of the elastic wave excited in the spurious mode to be more different between the first region 24A and the second region 24B, while further maintaining the uniformity of the frequency of the elastic wave excited in the main resonance mode. Thus, according to the present embodiment, the strength of the spurious signal by scattering the frequency of the elastic wave excited in the spurious mode can be reduced while maintaining the uniformity of the resonant frequency in the same elastic wave resonator 4.

In particular, from the perspective of improving the characteristics of the elastic wave excited in the elastic wave resonator 4, it is preferable in the present embodiment that the frequency of the elastic wave excited in the main resonance mode be the same in the first region 24A and the second region 24B. In this case, the resonant frequency in a region of 80% or more of the region where the electrode fingers 14 are located is preferably identical to the resonant frequency of the elastic wave in the first region 24A and the second region 24B. This may further improve the characteristics of the elastic wave excited in the elastic wave resonator 4. In this case, the region where the electrode fingers 14 are located refers to a region where the electrode fingers 14 are formed in a plan view within the electrode finger placement region 24.

In the present embodiment, the first region 24A and the second region 24B may be mixed with regions where the frequency of the elastic wave excited in the main resonance mode is the same or different. For example, the first region 24A may include an electrode finger 14 having an irregular electrode finger design at an end portion on the reflector 18 side in order to adjust the characteristics of the elastic wave resonator 4. In addition, in the first region 24A and the second region 24B, the IDT electrode 8 may include a region where a discontinuous electrode finger design is made in the propagation direction TD.

In the present embodiment, the electrode finger placement regions 24 symmetrically include the first regions 24A with respect to the second region 24B in the propagation direction TD. Due to this, a profile such as the pitch and duty ratio of the electrode fingers 14 of the elastic wave resonator 4 may be designed symmetrically in the propagation direction TD. Thus, in the present embodiment, the characteristics of the elastic wave excited in the elastic wave resonator 4 can be further improved.

In the elastic wave resonator 4 according to the present embodiment, the electrode finger placement region 24 may symmetrically include the second regions 24B with respect to the first region 24A in the propagation direction TD. In other words, the elastic wave resonator 4 according to the present embodiment may include symmetrically, with respect to one of the first region 24A and the second region 24B, the other one of the first region 24A and the second region 24B in the propagation direction TD.

In the present embodiment and various embodiments to be described below, the behavior of a resonant frequency in each elastic wave resonator is described as an example. In general, the resonant frequency and the antiresonant frequency of the elastic wave resonator exhibit similar behavior to each other with respect to a change in pitch or duty ratio. Accordingly, in the various embodiments, a part where the description is given exemplifying the behavior of the resonant frequency may be rewritten replacing the resonant frequency with the antiresonant frequency. In other words, the elastic wave resonator 4 may have frequency effective characteristics acting in a direction to cancel out effects on a higher antiresonant frequency and a lower antiresonant frequency caused by a difference in the pitch between the first electrode finger group 14A and the second electrode finger group 14B.

Second Embodiment

Intermediate Region

Figure 6:
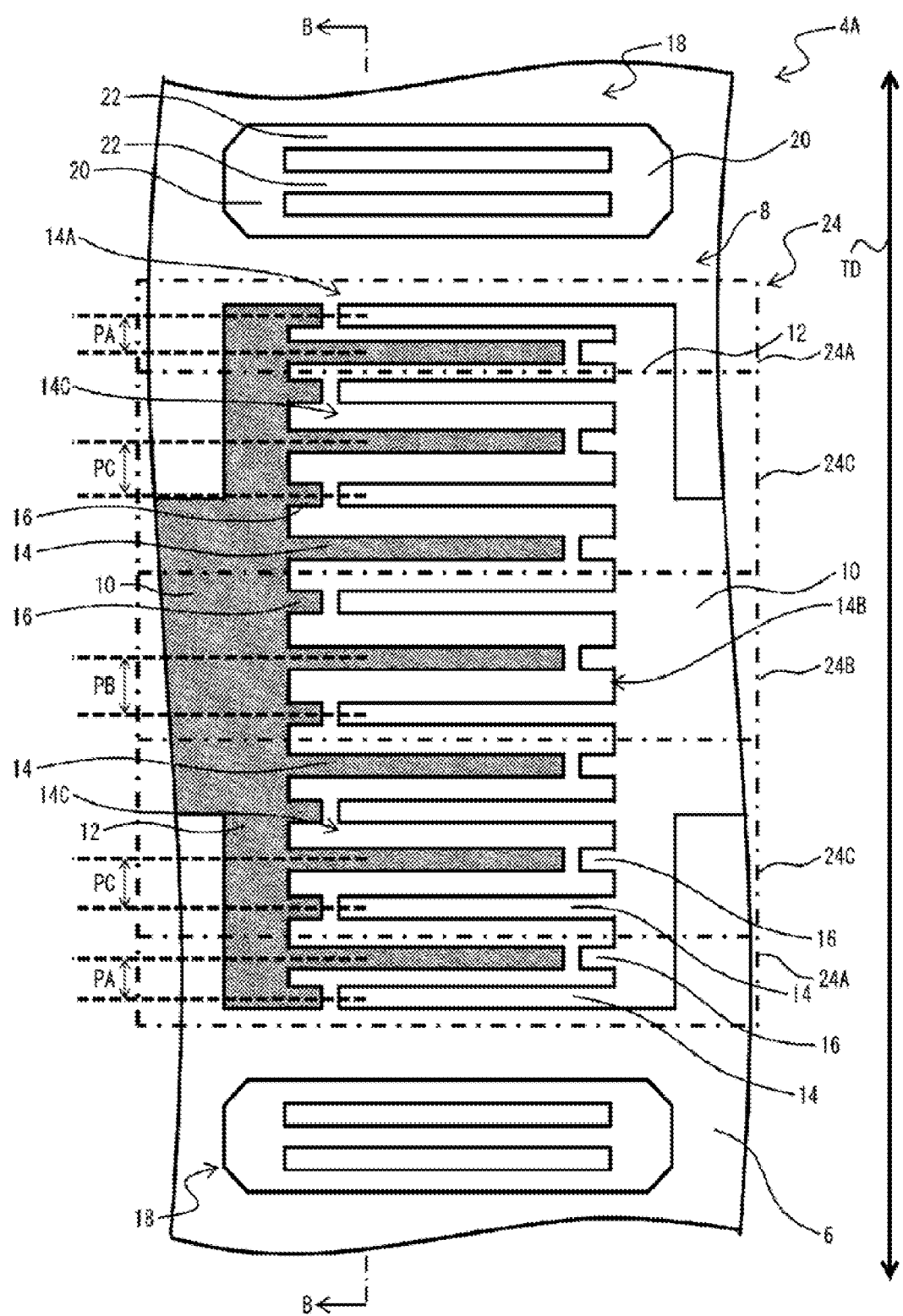
FIG. 6 is a schematic plan view of an elastic wave resonator according to a second embodiment of the present disclosure.
Figure 7:
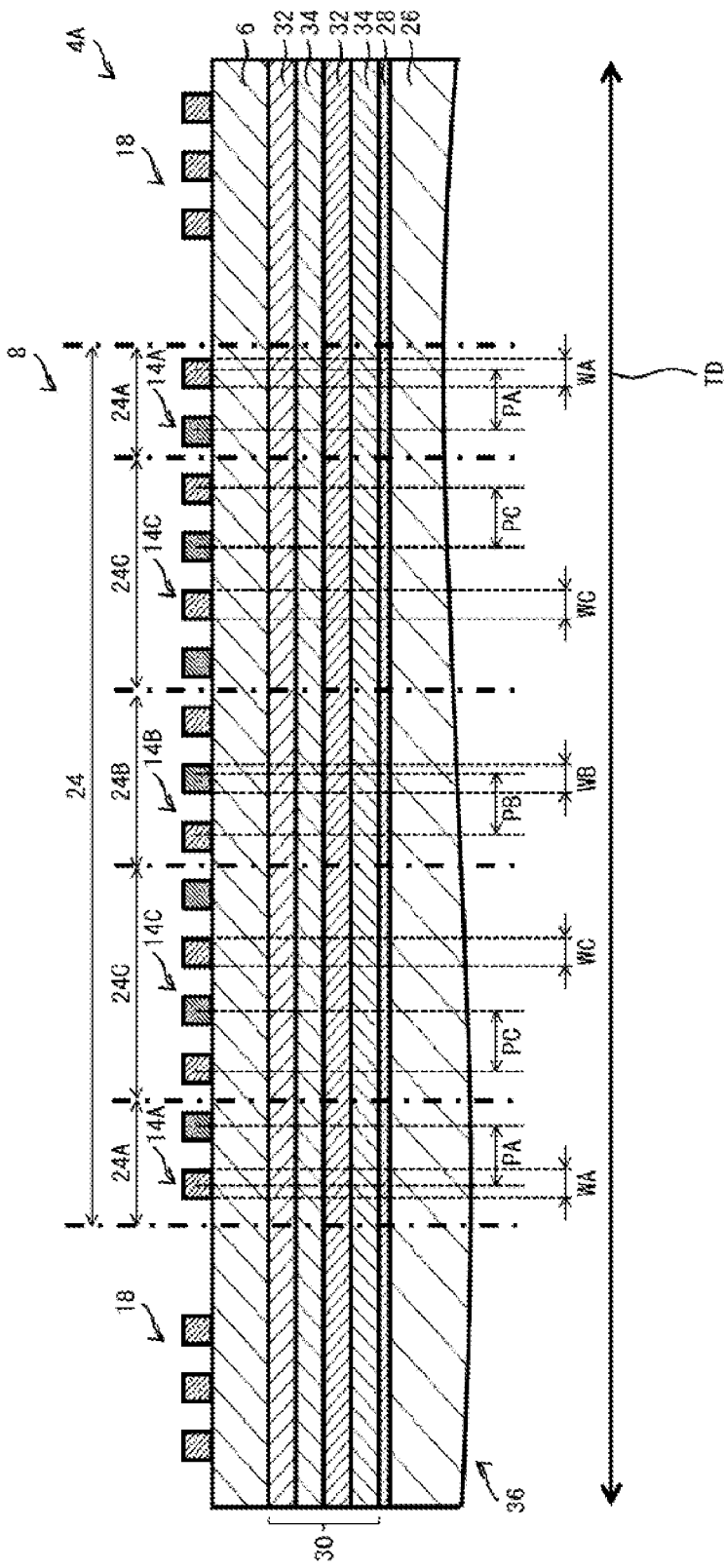
FIG. 7 is a schematic cross-sectional view of an elastic wave resonator according to the second embodiment of the present disclosure.

FIG. 6 is a schematic plan view of an elastic wave resonator 4A according to the present embodiment. FIG. 7 is a schematic cross-sectional view of the elastic wave resonator 4A according to the present embodiment, and is a cross-sectional view taken along an arrow line B-B in FIG. 6. In the present specification, each member having the same function is denoted by the same name and assigned with the same reference sign, and description is not repeated as long as there is no difference in the configuration.

The electrode finger placement region 24 of the elastic wave resonator 4A according to the present embodiment further includes an intermediate region 24C, which is different from the first region 24A and the second region 24B, in a plan view as illustrated in FIGS. 6 and 7. In particular, the electrode finger placement region 24 of the elastic wave resonator 4A according to the present embodiment symmetrically includes the first regions 24A with respect to the second region 24B in the propagation direction TD, and includes the intermediate regions 24C respectively between the first region 24A and the second region 24B.

The electrode fingers 14 further include an intermediate electrode finger group 14C, which is different from a first electrode finger group 14A and a second electrode finger group 14B and is located in the intermediate region 24C. An intermediate pitch PC of the intermediate electrode finger group 14C has a value between a first pitch PA of the first electrode finger group 14A and a second pitch PB of the second electrode finger group 14B.

The resonant frequency of the main resonance of the intermediate electrode finger group 14C has a value between the resonant frequency of the main resonance of the first electrode finger group 14A and the resonant frequency of the main resonance of the second electrode finger group 14B. In the present embodiment, by appropriately designing the duty ratio of the intermediate electrode finger group 14C from the pitch of the intermediate electrode finger group 14C by using the relational expression depicted in FIG. 3, the resonant frequency of the main resonance of the intermediate electrode finger group 14C can be designed. When the resonant frequency of the main resonance of the first electrode finger group 14A is identical to the resonant frequency of the main resonance of the second electrode finger group 14B, the resonant frequency of the main resonance of the intermediate electrode finger group 14C is also identical to the resonant frequency of the main resonance of the first electrode finger group 14A and the second electrode finger group 14B.

In the present embodiment, for example, the intermediate pitch PC of each intermediate electrode finger group 14C gradually changes from the first region 24A side toward the second region 24B side. Specifically, for example, when the first pitch PA is 0.708 μm and the second pitch PB is 0.745 μm, the intermediate pitch PC increases monotonically from 0.708 μm to 0.745 μm from the first region 24A side toward the second region 24B side.

When the intermediate pitch PC of the intermediate electrode finger group 14C gradually changes from the first region 24A side toward the second region 24B side, the duty ratio of the intermediate electrode finger group 14C also gradually changes from the first region 24A side toward the second region 24B side. Specifically, in the case of the above-described example, the duty ratio of the intermediate electrode finger group 14C decreases monotonically from 0.6 to 0.3 from the first region 24A side toward the second region 24B side. Herein, the duty ratio at each position of the intermediate electrode finger group 14C is designed in such a manner that the resonant frequency of the main resonance of the intermediate electrode finger group 14C is set between the resonant frequency of the main resonance of the first electrode finger group 14A and the resonant frequency of the main resonance of the second electrode finger group 14B at any position.

Effect of Elastic Wave Resonator According to Second Embodiment

The elastic wave resonator 4A according to the present embodiment further includes the intermediate electrode finger group 14C, whose pitch differs from both the pitches of the first electrode finger group 14A and the second electrode finger group 14B, in the same resonator. The resonant frequency of the main resonance of the elastic wave in the intermediate region 24C, in which the intermediate electrode finger group 14C is located, has a value between the resonant frequency of the main resonance of the elastic wave in the first region 24A and the resonant frequency of the main resonance of the elastic wave in the second region 24B.

This makes it possible to cause the frequency of the elastic wave excited in the spurious mode to be more different among the first electrode finger group 14A, the second electrode finger group 14B, and the intermediate electrode finger group 14C, while further maintaining the uniformity of the frequency of the elastic wave excited in the main resonance mode. Thus, according to the present embodiment, the strength of a spurious signal may be further reduced while maintaining uniformity of the resonant frequency within the same elastic wave resonator 4A.

In the present embodiment, the pitch and duty ratio in the intermediate region 24C are also different at each location in the intermediate region 24C. This makes it possible to cause the frequency of the elastic wave excited in the spurious mode to differ also at each position in the intermediate region 24C. Thus, according to the present embodiment, the strength of the spurious signal may be further reduced while maintaining uniformity of the resonant frequency within the same elastic wave resonator 4A.

In the present embodiment, the pitch and duty ratio in the intermediate region 24C gradually change within the intermediate region 24C. This makes it possible to suppress a large change in profile such as the pitch, the duty ratio and the like at each position in the elastic wave resonator 4A. Thus, in the present embodiment, the characteristics of the elastic wave excited in the elastic wave resonator 4A can be further improved.

The number of electrode fingers 14 constituting the first region 24A may be at least two, and the number thereof constituting the second region 24B may also be at least two. In this case, the pitch and duty ratio of the electrode fingers 14 in the overall electrode finger placement region 24 including the intermediate region 24C are gradually changed.

Characteristics Comparison Between Examples and Comparative Examples

The characteristics of elastic wave resonators of Example 1, Example 2, and Example 3 each having a configuration corresponding to the elastic wave resonator 4A according to the present embodiment were calculated by simulation.

As for the elastic wave resonator according to Example 1, parameters such as the dimensions of each member were set as follows except the values exemplified in the first embodiment. The IDT electrode 8 and the reflector 18 used Al with a thickness of 0.13 μm. The electrode finger placement region 24, as in the electrode finger placement region 24 according to the present embodiment, symmetrically includes the first regions 24A with respect to the second region 24B in the propagation direction TD, and includes intermediate regions 24C respectively between the first regions 24A and the second region 24B. However, the duty ratio of the electrode fingers 14 of the IDT electrode 8 was set to increase monotonically from 0.3 to 0.6 over the first region 24A, the intermediate region 24C, and the second region 24B. The fixation substrate 36 of the elastic wave resonator according to Example 1 was provided with the reflective multilayer film 30 formed by alternately layering a total of eight layers of first layers 32 and second layers 34 on the support substrate 26 made of Si, and the piezoelectric body 6 was formed thereon. The first layer 32 is made of $SiO_2$ with a thickness of 0.2 μm, and the second layer 34 is made of $HfO_2$ with a thickness of 0.17 μm. A thickness D6 of the piezoelectric body 6 was set to be 0.415 μm. As the piezoelectric body 6, an LT crystal with 114° Y-cut X propagation was used.

As for the elastic wave resonator according to Example 2, parameters such as the dimensions of each member were set as follows. The IDT electrode 8 and the reflector 18 used Al with a thickness of 0.18 μm. The electrode finger placement region 24, as in the electrode finger placement region 24 according to the present embodiment, symmetrically includes the first regions 24A with respect to the second region 24B in the propagation direction TD, and includes the intermediate regions 24C respectively between the first regions 24A and the second region 24B. However, the duty ratio of the electrode fingers 14 of the IDT electrode 8 was set to increase monotonically from 0.3 to 0.6 over the first region 24A, the intermediate region 24C, and the second region 24B. The pitch of the electrode fingers 14 was set to be 1 μm at a position where the duty ratio was 0.5, and the pitch at each position of the electrode fingers 14 was changed so that the resonant frequency was constant at any position in the electrode finger placement region 24. The fixation substrate 36 of the elastic wave resonator according to Example 2 was constituted in such a manner that the piezoelectric body 6 was directly formed on the support substrate 26 made of Si, and the thickness D6 of the piezoelectric body 6 was set to be 24 μm.

As for the elastic wave resonator according to Example 3, parameters such as the dimensions of each member were set as follows. The IDT electrode 8 and the reflector 18 used Al with a thickness of 0.135 μm. The electrode finger placement region 24, as in the electrode finger placement region 24 according to the present embodiment, symmetrically includes the first regions 24A with respect to the second region 24B in the propagation direction TD, and includes intermediate regions 24C respectively between the first regions 24A and the second region 24B. However, the duty ratio of electrode fingers 14 of the IDT electrode 8 was set to increase monotonically from 0.3 to 0.6 over the first region 24A, the intermediate region 24C, and the second region 24B. The pitch of the electrode fingers 14 was set to be 0.751 µm at a position where the duty ratio was 0.5, and the pitch at each position of the electrode fingers 14 was changed so that the resonant frequency was constant at any position in the electrode finger placement region 24. The fixation substrate 36 of the elastic wave resonator according to Example 3 was constituted in such a manner that the piezoelectric body 6 was directly formed on the support substrate 26 made of Si, and the thickness D6 of the piezoelectric body 6 was set to be 2.2 µm.

As comparison targets with respect to the elastic wave resonators according to Example 1, Example 2, and Example 3, respectively, characteristics of elastic wave resonators according to Comparative Example 1, Comparative Example 2, and Comparative Example 3 were also calculated by simulation.

The elastic wave resonator according to Comparative Example 1 differs only in a point that the duty ratio of the electrode fingers 14 is 0.6 and the pitch thereof is 0.708 at any position in the electrode finger placement region 24 when compared with the elastic wave resonator according to Example 1. The elastic wave resonator according to Comparative Example 2 differs only in a point that the duty ratio of the electrode fingers 14 is 0.6 and the pitch thereof is 0.995 µm at any position in the electrode finger placement region 24 when compared with the elastic wave resonator according to Example 2. The elastic wave resonator according to Comparative Example 3 differs only in a point that the duty ratio of the electrode fingers 14 is 0.6 and the pitch thereof is 0.748 µm at any position in the electrode finger placement region 24 when compared with the elastic wave resonator according to Example 3.

Figure 8:
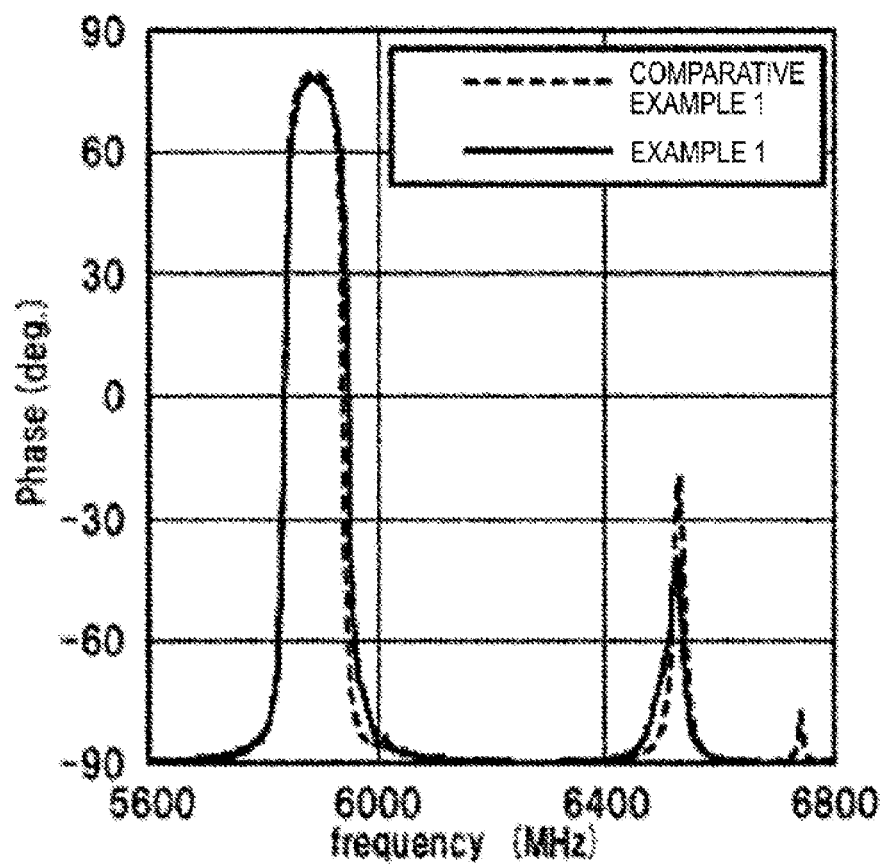
FIG. 8 is a graph depicting characteristics of an elastic wave resonator according to the second embodiment of the present disclosure.
Figure 9:
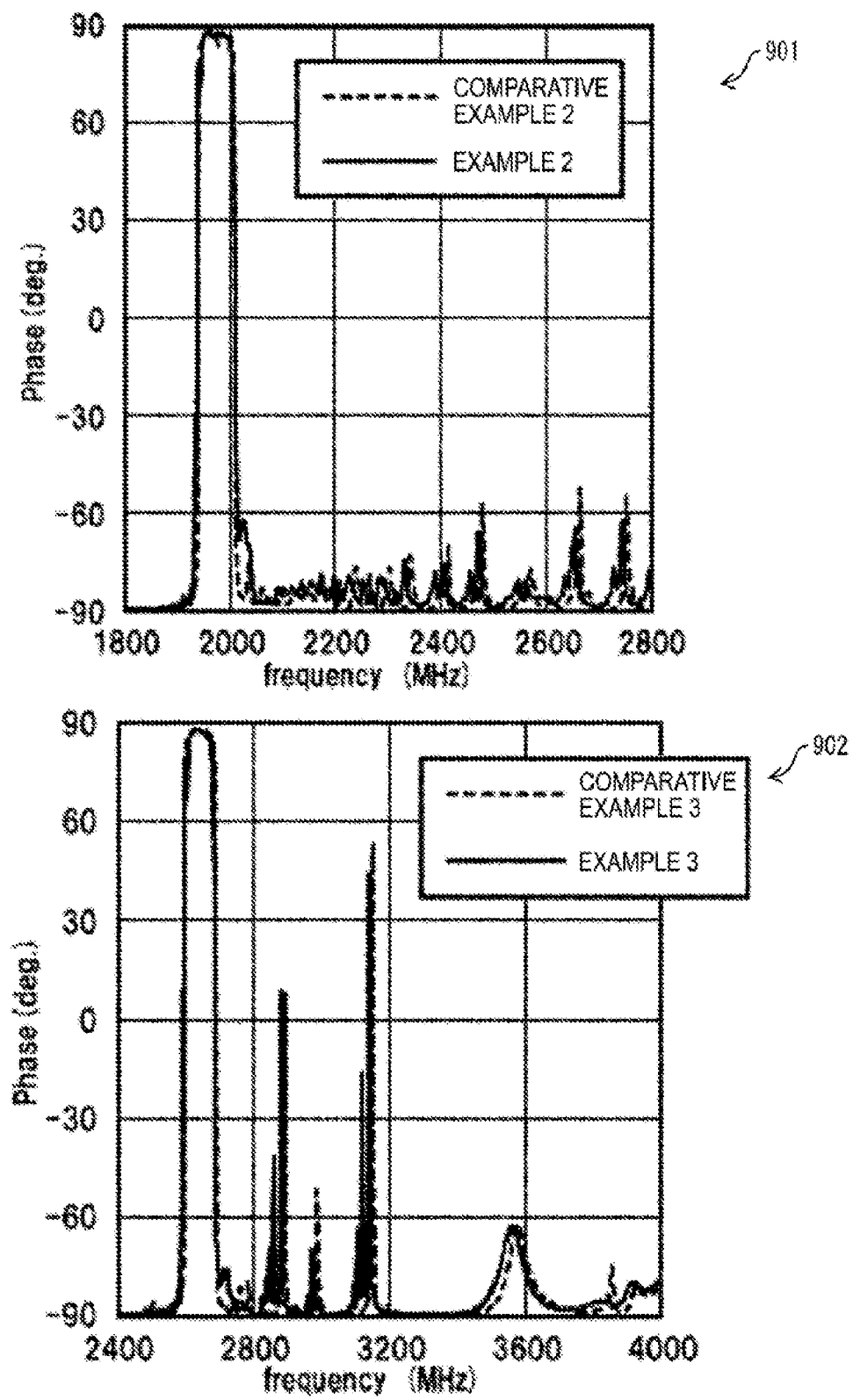
FIG. 9 includes other graphs depicting characteristics of an elastic wave resonator according to the second embodiment of the present disclosure.

FIGS. 8 and 9 include graphs depicting characteristics of elastic waves excited in the elastic wave resonators according to Examples and Comparative Examples, and each of the graphs depicts a phase of impedance at each frequency in the elastic wave resonator. In each of the graphs in FIGS. 8 and 9, the vertical axis represents phase (units: deg), and the horizontal axis represents frequency (units: MHz). The graph in FIG. 8 depicts the characteristics of the elastic wave resonator according to Example 1 with a solid line, and the characteristics of the elastic wave resonator according to Comparative Example 1 with a dashed line. In FIG. 9, graph 901 depicts the characteristics of the elastic wave resonator according to Example 2 with a solid line, and the characteristics of the elastic wave resonator according to Comparative Example 2 with a dashed line. In FIG. 9, graph 902 depicts the characteristics of the elastic wave resonator according to Example 3 with a solid line, and the characteristics of the elastic wave resonator according to Comparative Example 3 with a dashed line.

As is apparent from the graph in FIG. 8, the resonant frequencies and the strength of the elastic waves at a frequency near 5800 MHz to 5900 MHz oscillating in the main resonance mode of the elastic wave resonators according to Example 1 and Comparative Example 1 are substantially identical. However, the strength of the elastic wave at a frequency of 5900 MHz or more oscillating in the spurious mode of the elastic wave resonator according to Example 1 is reduced as compared with Comparative Example 1.

As is apparent from graph 901 in FIG. 9, the resonant frequencies and the strength of the elastic waves at a frequency near 1900 MHz to 2000 MHz oscillating in the main resonance mode of the elastic wave resonators according to Example 2 and Comparative Example 2 are substantially identical. However, the strength of the elastic wave at a frequency of 2200 MHz or more oscillating in the spurious mode of the elastic wave resonator according to Example 2 is reduced as compared with Comparative Example 2.

As is apparent from graph 902 in FIG. 9, the resonant frequencies and strength of the elastic waves at a frequency near 2600 MHz to 2700 MHz oscillating in the main resonance mode of the elastic wave resonators according to Example 3 and Comparative Example 3 are substantially identical. However, the strength of the elastic wave at a frequency of 2800 MHz or more oscillating in the spurious mode of the elastic wave resonator according to Example 3 is reduced as compared with Comparative Example 3.

Thus, the elastic wave resonator according to each of Examples may reduce the strength of the elastic wave oscillating in the spurious mode while maintaining the strength of the elastic wave oscillating in the main resonance mode, as compared with the elastic wave resonator whose pitch and duty ratio of the electrode fingers 14 are constant.

Figure 10:
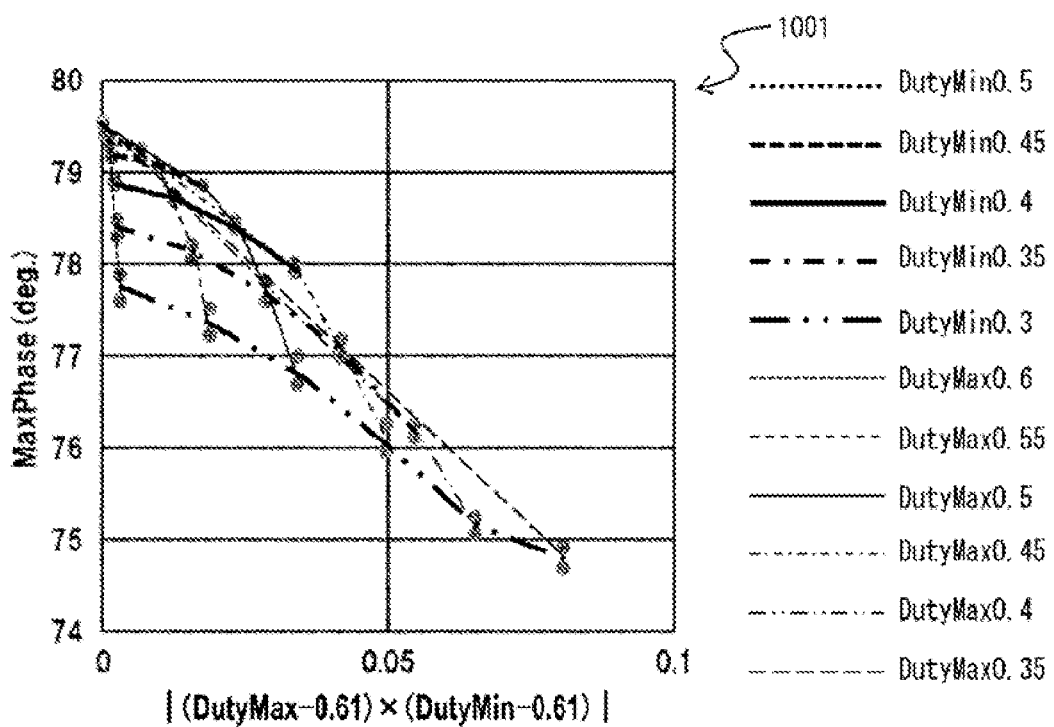
FIG. 10 includes graphs each depicting characteristics of an elastic wave resonator when a maximum value and a minimum value of a duty ratio are changed for the elastic wave resonator according to the second embodiment of the present disclosure.
Figure 10:
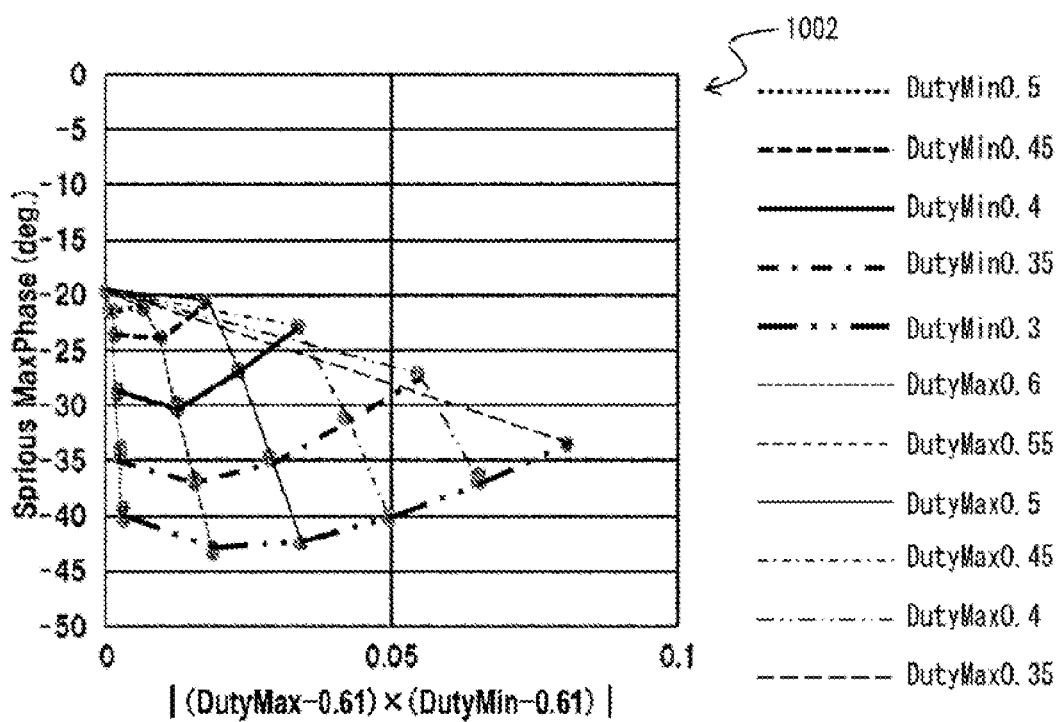

Relationship Between Characteristics and Maximum and Magnitude Values of Duty Ratio In the elastic wave resonator 4A according to the present embodiment, the characteristics of each elastic wave resonator 4A when a maximum value and a minimum value of the duty ratio of the electrode finger 14 were changed were calculated by simulation, and depicted in graphs in FIG. 10. The simulation was carried out under the assumption that each of the elastic wave resonators 4A, whose characteristics are depicted in the graphs in FIG. 10, had a configuration corresponding to Example 1 except for the maximum value and the minimum value of the duty ratio of the electrode finger 14.

Each graph in FIG. 10 depicts a maximum phase of impedance of each elastic wave resonator 4A when the maximum value and the minimum value of the duty ratio of the electrode finger 14 are changed in the elastic wave resonator 4A according to the present embodiment.

In FIG. 10, graph 1001 depicts the maximum phase of impedance for a frequency of the elastic wave oscillating in the main resonance mode of each elastic wave resonator 4A. In other words, graph 1001 in FIG. 10 is a graph depicting the maximum strength of the elastic wave oscillating in the main resonance mode of each elastic wave resonator 4A.

In FIG. 10, graph 1002 depicts the maximum phase of impedance for a frequency of the elastic wave oscillating in the spurious mode of each elastic wave resonator 4A. In graph 1002, the frequency at which the phase of impedance is maximized among the frequencies of the elastic waves oscillating in all the spurious modes is depicted. In other words, graph 1002 in FIG. 10 is a graph depicting the maximum strength of the elastic wave oscillating in the spurious mode of each elastic wave resonator 4A.

In each graph of FIG. 10, the vertical axis represents phase (units: deg), and the horizontal axis represents an absolute value of a value obtained in the following manner: 0.61 is subtracted from each of the maximum value and the minimum value of the duty ratio of the electrode finger 14, and the values obtained by the subtractions are multiplied together.

While the maximum value of the duty ratio was changed from 0.6 to 0.35 in increments of 0.05, and the minimum value of the duty ratio was changed from 0.5 to 0.3 in increments of 0.05, each of the maximum phases was calculated by simulation, and the results of the calculations were plotted on each of the graphs in FIG. 10. Each thin line in each graph of FIG. 10 is a line connecting the plots with equal maximum values of the duty ratio. Each thick line in each graph of FIG. 10 is a line connecting the plots with equal minimum values of the duty ratio.

As is apparent from graph 1001 in FIG. 10, the smaller the difference between the maximum value and the minimum value of the duty ratio is, the higher the maximum strength of the elastic wave oscillating in the main resonance mode tends to be. The larger the difference between the maximum value and the minimum value of the duty ratio is, the higher the maximum strength of the elastic wave oscillating in the main resonance mode tends to be.

As is apparent from graph 1002 in FIG. 10, the larger the difference between the maximum value and the minimum value of the duty ratio is, the lower the maximum strength of the elastic wave oscillating in the spurious mode tends to be. The larger the minimum value of the duty ratio is, the lower the maximum strength of the elastic wave oscillating in the spurious mode tends to be; however, the maximum strength tends to be minimum when the maximum value of the duty ratio is set to be 0.55.

As described above, regarding the elastic wave resonator 4A according to the present embodiment, when the maximum strength of the elastic wave oscillating in the main resonance mode is desired to be high, it is sufficient to cause a difference between the maximum value and minimum value of the duty ratio of the electrode finger 14 to be small. As for the elastic wave resonator 4A according to the present embodiment, when the maximum strength of the elastic wave oscillating in the spurious mode is to be kept low, it is sufficient to cause the difference between the maximum value and minimum value of the duty ratio of the electrode finger 14 to be large. The design of the maximum value and the minimum value of the duty ratio may be appropriately determined comprehensively taking into consideration the usage of the elastic wave resonator 4A and the like. Each of the above-described trends of the elastic wave resonator 4A does not depend on a value of the duty ratio of the strip electrode 22 of the reflector 18.

Change Amount of Pitch in Intermediate Region

Figure 11:
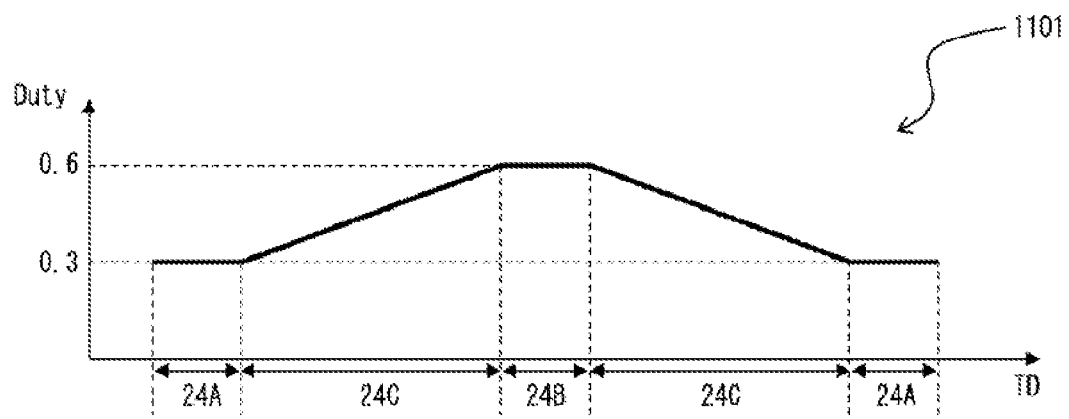
FIG. 11 includes graphs each depicting a change in a duty ratio of an electrode finger of an elastic wave resonator according to the second embodiment of the present disclosure.
Figure 11:
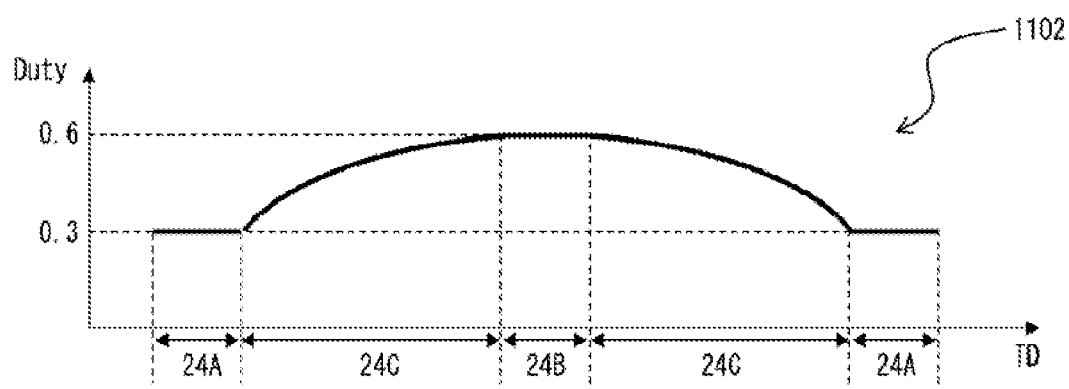

FIG. 11 includes graphs each indicating a relationship between a position on the elastic wave resonator 4A in the propagation direction TD and the duty ratio for the electrode fingers 14 of the elastic wave resonator 4A according to the present embodiment. In each of the graphs of FIG. 11, the horizontal axis represents the positions on the elastic wave resonator 4A, where the electrode fingers 14 are formed, in the propagation direction TD, and the vertical axis represents the duty ratio of the electrode finger 14 at the corresponding position. Reference signs 24A, 24B, and 24C indicated on the horizontal axis correspond to the positions where the first region 24A, the second region 24B, and the intermediate region 24C are respectively formed.

In the present embodiment, the duty ratio of the electrode fingers 14 formed in the intermediate region 24C may change linearly from the first region 24A toward the second region 24B, as depicted in graph 1101. Alternatively, in the present embodiment, the duty ratio of the electrode fingers 14 formed in the intermediate region 24C may change nonlinearly from the first region 24A toward the second region 24B, as depicted in graph 1102. In other words, the change amount of the duty ratio of the electrode fingers 14 formed in the intermediate region 24C may gradually change from the first region 24A toward the second region 24B.

Because the duty ratio of the electrode fingers is determined for each of the electrode fingers, the values of the duty ratios are discretely plotted on the graphs depicted in FIG. 11. However, in the present specification, when the change in the duty ratio of the electrode fingers 14 is depicted in the graph, for simplicity of illustration, the duty ratio of the electrode fingers 14 is considered to be continuously changing.

Variations

First Intermediate Region and Second Intermediate Region

Figure 12:
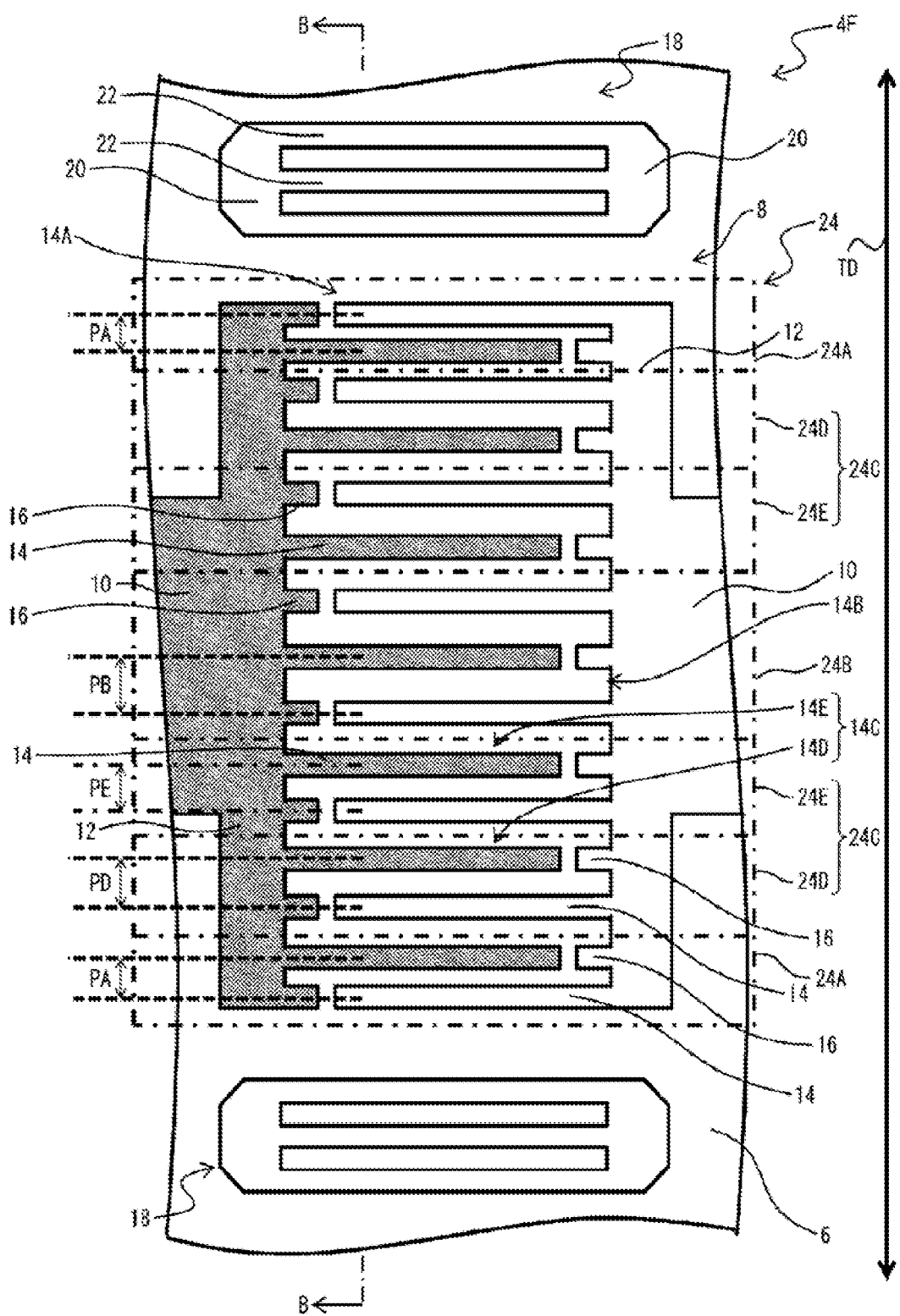
FIG. 12 is a schematic plan view illustrating another example of an elastic wave resonator according to the second embodiment of the present disclosure.

FIG. 12 is a schematic plan view of an elastic wave resonator 4F according to a variation of the present embodiment. As illustrated in FIG. 12, the intermediate region 24C of the elastic wave resonator 4F includes a first intermediate region 24D and a second intermediate region 24E. The intermediate electrode finger group 14C includes a first intermediate electrode finger group 14D formed in the first intermediate region 24D and a second intermediate electrode finger group 14E formed in the second intermediate region 24E.

A first intermediate pitch PD of the first intermediate electrode finger group 14D gradually changes based on a first change amount from the first region 24A side toward the second region 24B side. On the other hand, the pitch of the second intermediate electrode finger group 14E gradually changes from the first region 24A side toward the second region 24B side based on a second change amount different from the first change amount.

The first change amount and the second change amount may differ depending on the positions in the first intermediate region 24D and the second intermediate region 24E, respectively. The situation in which the first change amount and the second change amount differ refers to a case where, for example, the maximum value of the first change amount is smaller than the minimum value of the second change amount, or the minimum value of the first change amount is greater than the maximum value of the second change amount.

The resonant frequency of the main resonance of the first intermediate electrode finger group 14D and the resonant frequency of the main resonance of the second intermediate electrode finger group 14E have values between the resonant frequencies of the main resonance of the first electrode finger group 14A and the second electrode finger group 14B. The duty ratio of each of the first intermediate electrode finger group 14D and the second intermediate electrode finger group 14E also gradually changes from the first region 24A toward the second region 24B side.

Figure 13:
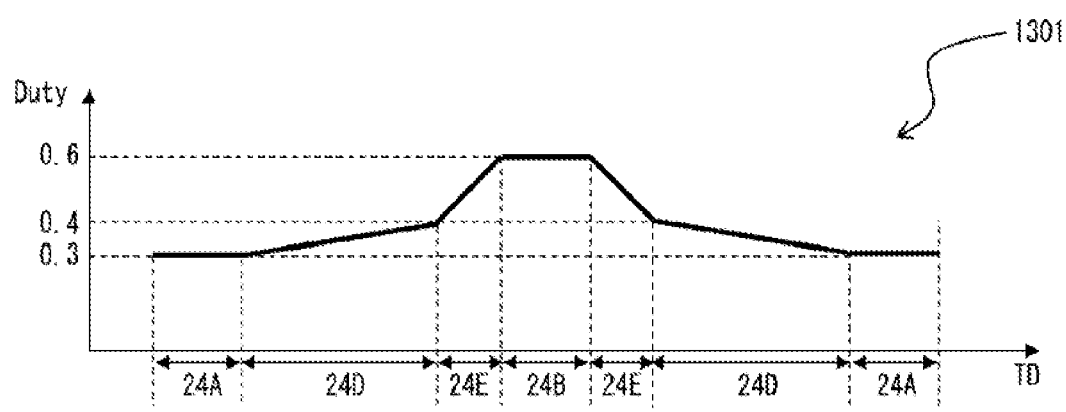
FIG. 13 includes graphs each depicting another example of a change in a duty ratio of an electrode finger of an elastic wave resonator according to the second embodiment of the present disclosure.
Figure 13:
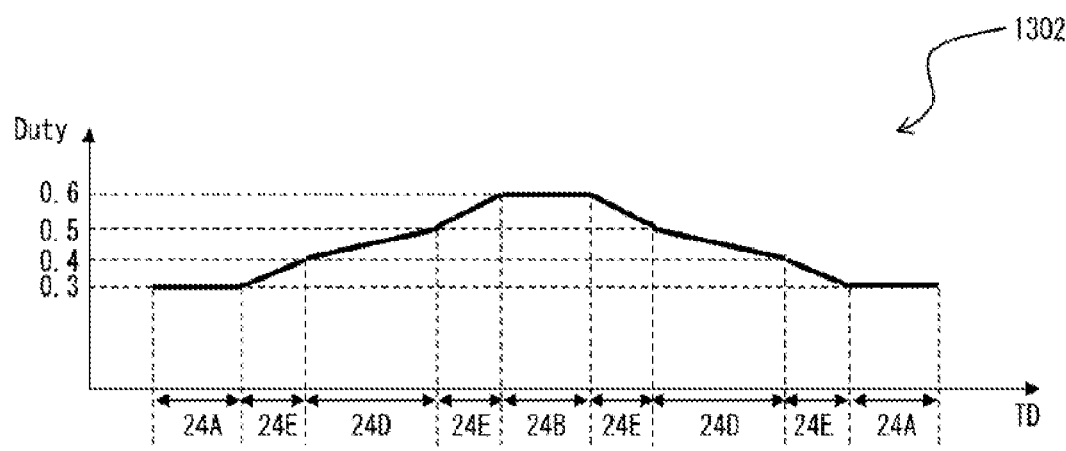

FIG. 13 includes graphs each indicating a relationship between a position on the elastic wave resonator 4F in the propagation direction TD and a duty ratio for the electrode fingers 14 of the elastic wave resonator 4F according to the present variation. In each of the graphs of FIG. 13, the horizontal axis represents the positions on the elastic wave resonator 4F, where the electrode fingers 14 are formed, in the propagation direction TD, and the vertical axis represents the duty ratio of the electrode fingers 14 at the corresponding position. Reference signs 24A, 24B, 24D, and 24E indicated on the horizontal axis correspond to the positions where the first region 24A, the second region 24B, the first intermediate region 24D, and the second intermediate region 24E are respectively formed.

In the present variation, the change amount of the first intermediate pitch PD is different from the change amount of a second intermediate pitch PE. Because of this, for example, as shown in graph 1301 in FIG. 13, the change amount of the duty ratio of the first electrode finger group 14D formed in the first intermediate region 24D is different from the change amount of the duty ratio of the second electrode finger group 14E formed in the second intermediate region 24E. Thus, the change amount of the duty ratio of the intermediate region 24C is changed from the first region 24A toward the second region 24B.

In the elastic wave resonator 4F according to the present variation, an example is cited in which one first intermediate region 24D and one second intermediate region 24E are formed in each intermediate region 24C, but the variation is not limited thereto. For example, in the elastic wave resonator 4F according to the present variation, two second intermediate regions 24E and one first intermediate region 24D between the two second intermediate regions 24E may be formed in each of the intermediate regions 24C. In this case, as shown in graph 1302 in FIG. 13, the change amount of the duty ratio of the intermediate region 24C may change twice or more from the first region 24A toward the second region 24B.

The elastic wave resonator 4F according to the present variation may change the change amount of the duty ratio depending on the position while gradually changing the duty ratio of the electrode fingers 14 in the intermediate region 24C. Thus, in the elastic wave resonator 4F, the distribution of the duty ratio of the electrode fingers 14 in the intermediate region 24C may be designed. For example, the elastic wave resonator 4F according to the present variation may reduce the area of the region in which the electrode finger 14 having a duty ratio unfavorable for reducing a spurious signal is formed. For example, the elastic wave resonator 4F may reduce the strength of the spurious signal by increasing the change amount of the duty ratio of the electrode finger 14 in the intermediate region 24C near the duty ratio at which the strength of the spurious signal is made relatively strong.

Dependence of Spurious Signal Strength

In general, the strength and frequency of a spurious signal generated in an elastic wave resonator vary depending on the duty ratio or pitch of electrode fingers, the thickness of a piezoelectric body, or the like of the elastic wave resonator. Examples of the dependence of the strength and frequency of a spurious signal generated in an elastic wave resonator are described below with reference to bubble charts illustrated in FIGS. 14 to 17.

FIGS. 14 to 17 are bubble charts depicting examples of the strength of a resonance wave generated in the elastic wave resonators according to the present embodiment and Comparative Examples. In each of the bubble charts of FIGS. 14 to 17, the horizontal axis represents the thickness of a piezoelectric body (units: μm), and the vertical axis represents a frequency (units: MHz). The size of a bubble in each bubble chart in FIGS. 14 to 17 indicates the strength of the generated elastic wave.

The bubble charts in each of FIGS. 14 to 17 indicate the strength of resonance waves generated in the elastic wave resonators according to the present embodiment and Comparative Examples when the duty ratios of the electrode fingers of the elastic wave resonators are set to 0.6, 0.5, 0.4, and 0.3, respectively.

Figure 14:
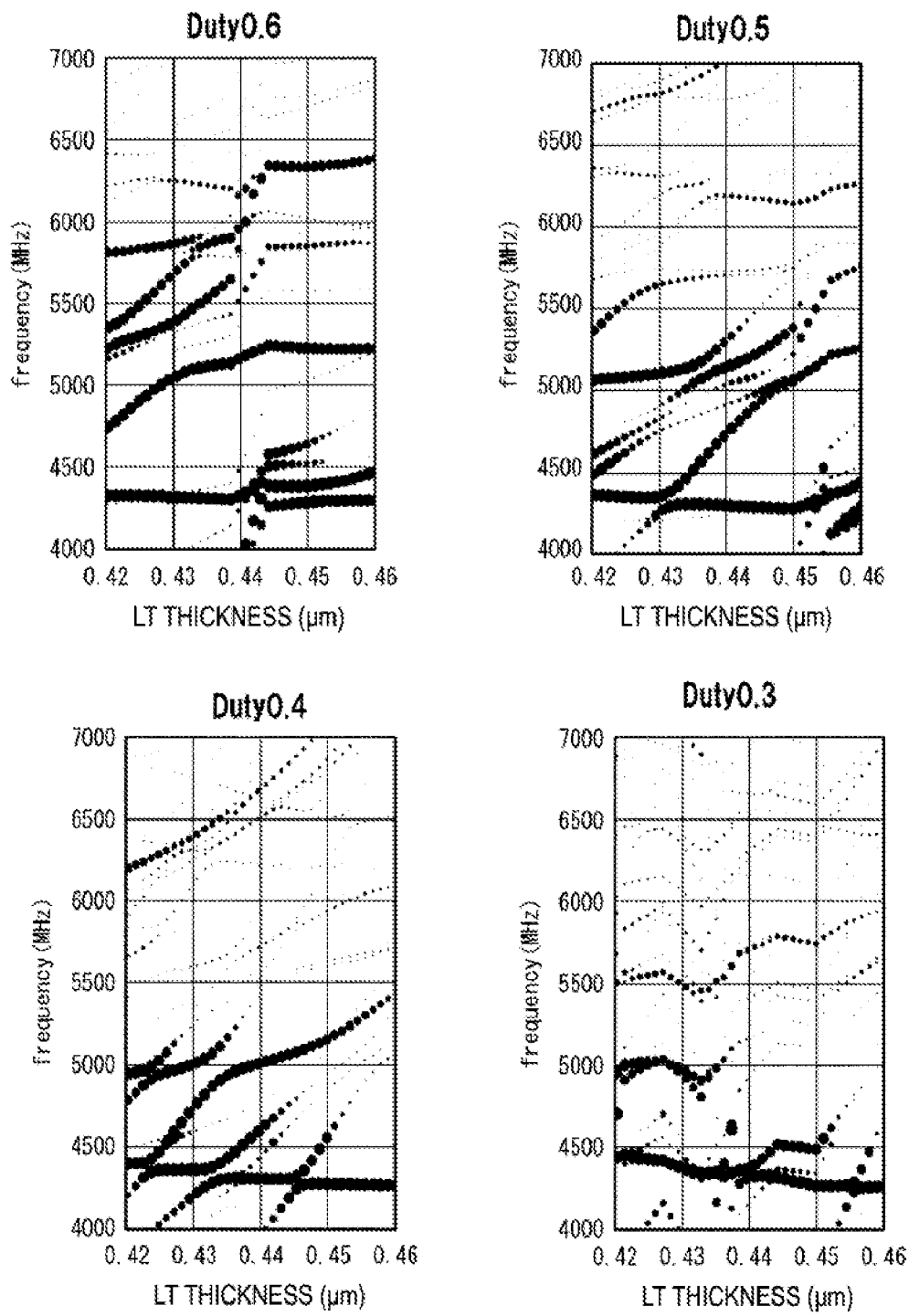
FIG. 14 includes bubble charts each depicting an example of strength of a resonance wave generated in an elastic wave resonator according to the second embodiment of the present disclosure.

In the bubble charts of FIG. 14, the characteristics when the frequency of the main resonance is considered to be 4250 MHz are depicted. In the bubble charts of FIG. 15, the characteristics when the frequency of the main resonance is considered to be 4500 MHz are depicted. In the bubble charts of FIG. 16, the characteristics when the frequency of the main resonance is considered to be 4700 MHz are depicted. In the bubble charts of FIG. 17, the characteristics when the frequency of the main resonance is considered to be 4900 MHz are depicted. Thus, in the bubble charts of FIGS. 14 to 17, the smaller the size of a bubble depicted at a position excluding the frequency of the main resonance is, the smaller the strength of the generated spurious signal is.

Figure 15:
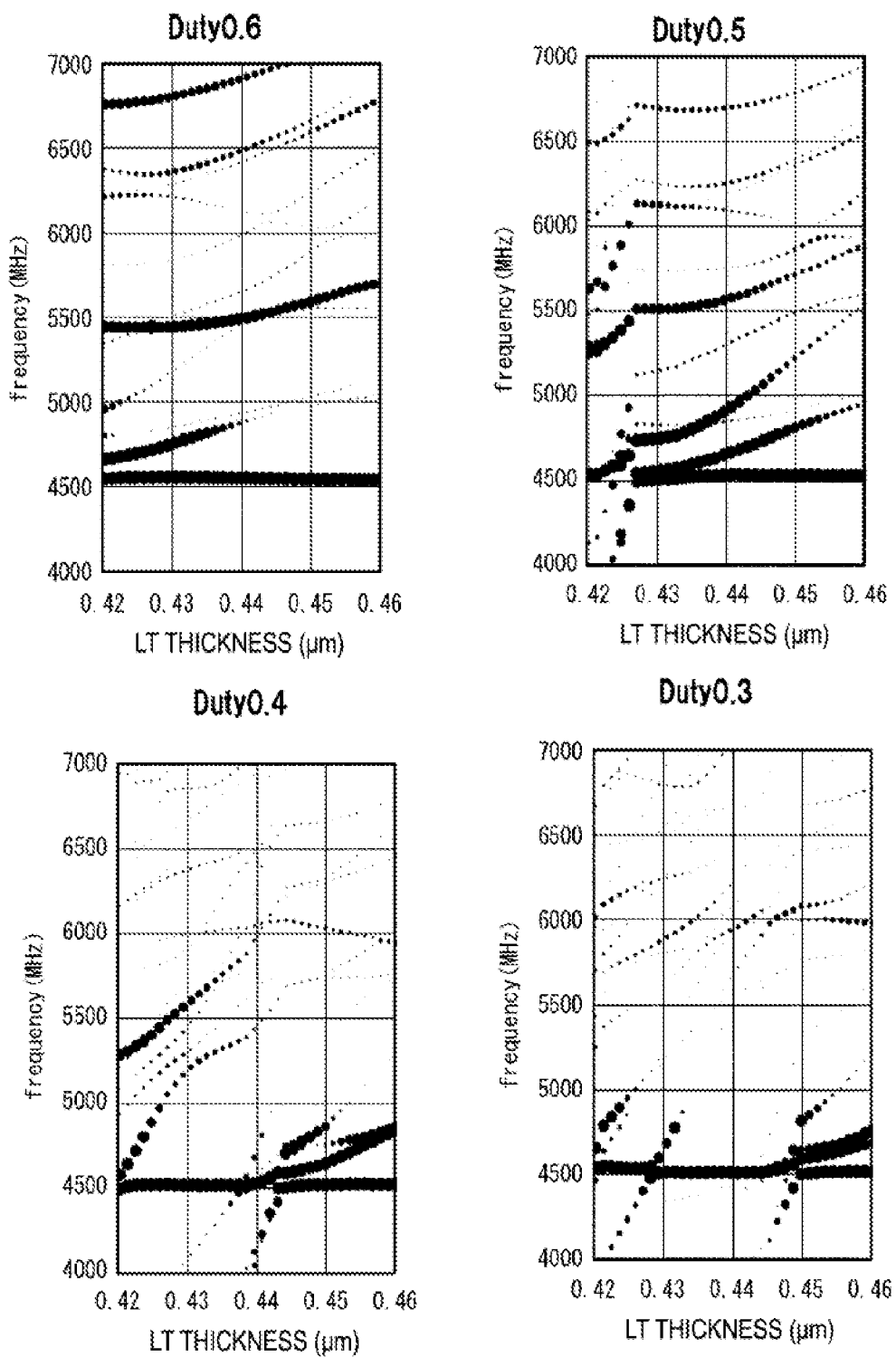
FIG. 15 includes other bubble charts each depicting an example of strength of a resonance wave generated in an elastic wave resonator according to the second embodiment of the present disclosure.
Figure 16:
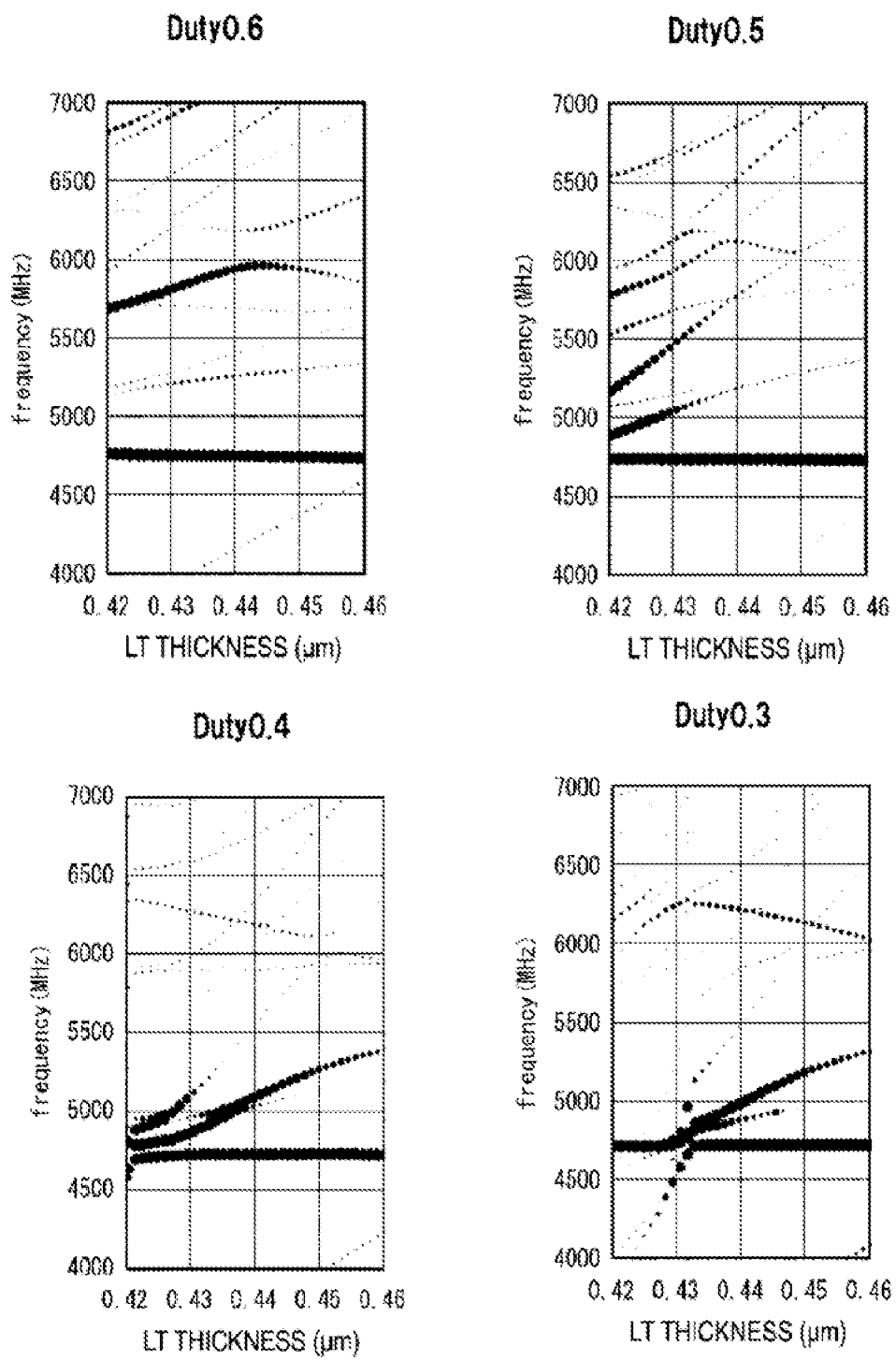
FIG. 16 includes other bubble charts each depicting an example of strength of a resonance wave generated in an elastic wave resonator according to the second embodiment of the present disclosure.
Figure 17:
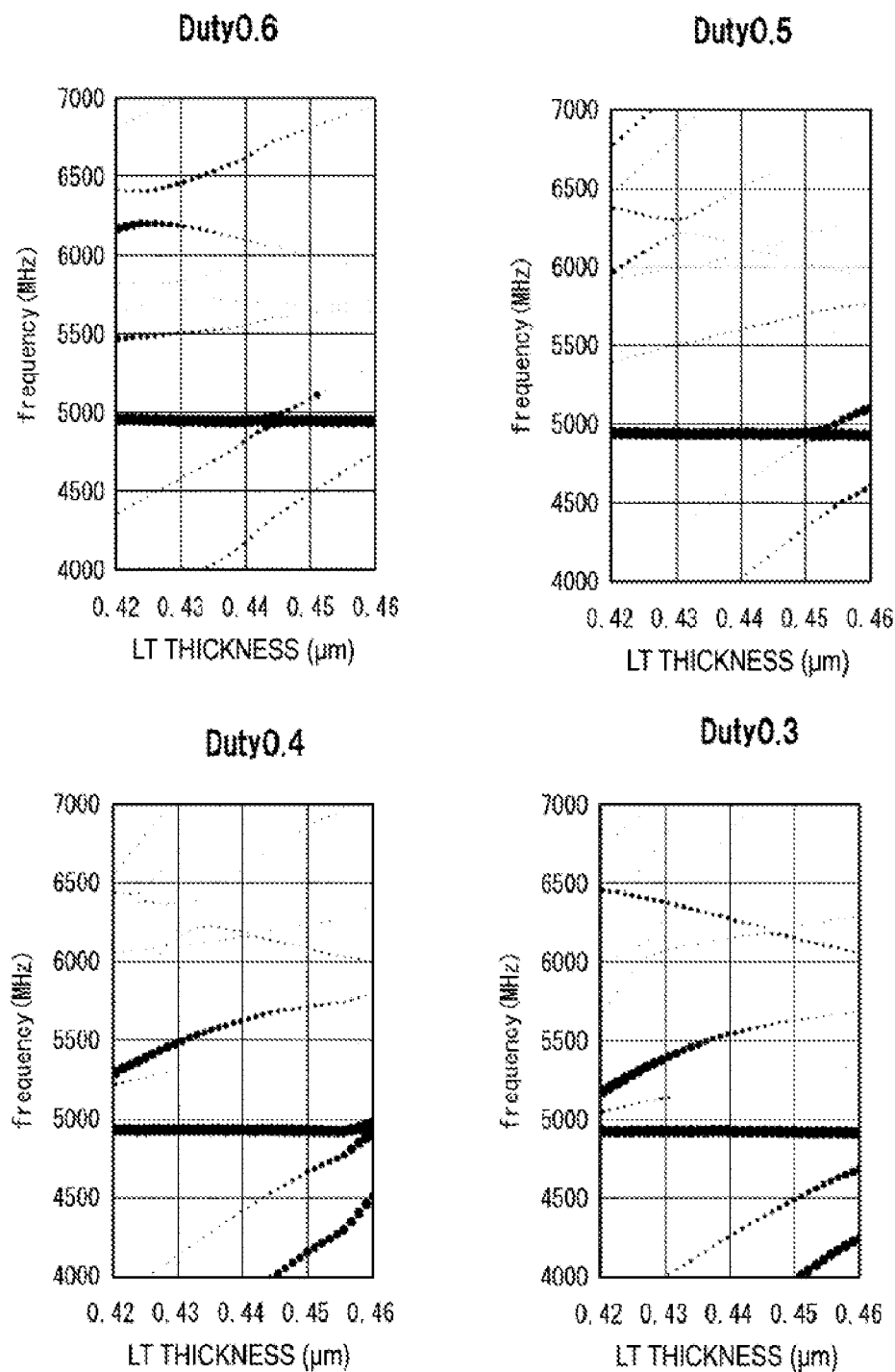
FIG. 17 includes other bubble charts each depicting an example of strength of a resonance wave generated in an elastic wave resonator according to the second embodiment of the present disclosure.

For example, in the elastic wave resonators whose characteristics are depicted in FIGS. 14 and 15, when the thickness of the elastic body is 0.44 μm, the strength of the spurious signal can be reduced in a case where the duty ratio is 0.3 or 0.4 as compared with a case where the duty ratio is 0.5 or 0.6. On the other hand, in the elastic wave resonators whose characteristics are depicted in FIGS. 16 and 17, when the thickness of the elastic body is 0.44 μm, the strength of the spurious signal can be reduced in a case where the duty ratio is 0.5 or 0.6 as compared with a case where the duty ratio is 0.3 or 0.4.

In this manner, as depicted in the bubble charts illustrated in FIGS. 14 to 17, the duty ratio of each of the electrode fingers that can reduce the strength of the spurious signal may be calculated by simulating the dependence of the strength of the spurious signal generated in the elastic wave resonator.

As for the elastic wave resonator 4F according to the present variation, the duty ratio of the electrode fingers 14 at which the strength of the spurious signal becomes relatively strong may be calculated for each elastic wave resonator 4F based on, for example, the characteristics of the bubble charts as illustrated in FIGS. 14 to 17. The characteristics of the elastic wave resonator as depicted in each of the bubble charts in FIGS. 14 to 17 may be calculated as appropriate by a known technique. Thus, in the elastic wave resonator 4F, a region where the change amount of the duty ratio of the electrode finger 14 in the intermediate region 24C increases may be calculated.

Characteristics of Elastic Wave Resonator According to Variation

Figure 18:
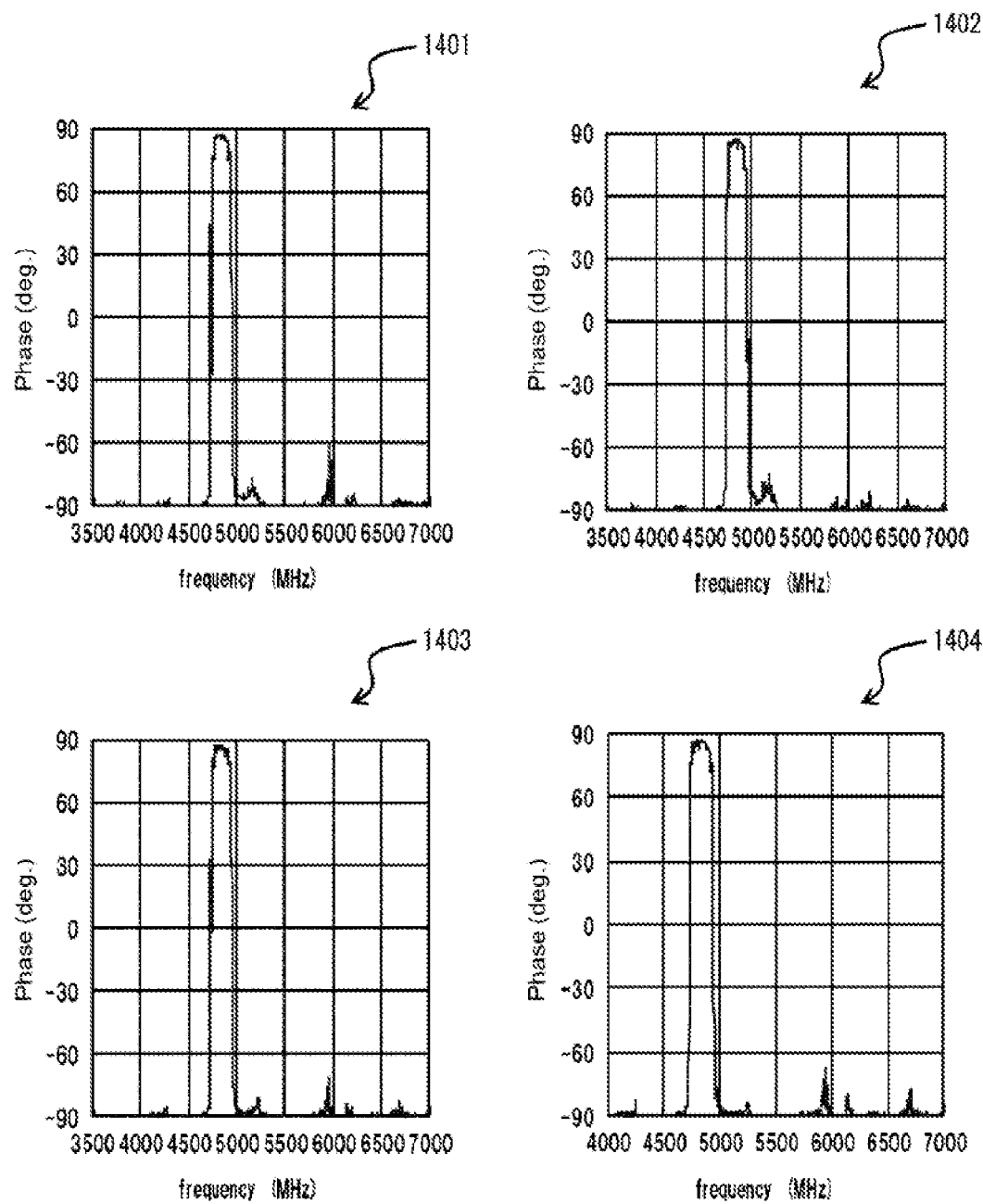
FIG. 18 includes graphs depicting characteristics of elastic wave resonators when a change amount of a duty ratio of an electrode finger is changed for the elastic wave resonator according to the second embodiment and an elastic wave resonator according to a variation of the present disclosure.

FIG. 18 includes graphs depicting characteristics of elastic waves excited in elastic wave resonators having an identical configuration to the elastic wave resonator 4A according to the present embodiment or the elastic wave resonator 4F according to the present variation, and in each of the graphs, a phase of impedance at each frequency in the elastic wave resonator is depicted. In other words, the graphs in FIG. 18 are graphs each depicting the strength of the elastic wave oscillating in the elastic wave resonator at each frequency. In the graphs of FIG. 18, the vertical axis represents phase (units: deg), and the horizontal axis represents frequency (units: MHz).

In FIG. 18, graph 1401 indicates the characteristics of the elastic wave resonator in the elastic wave resonator 4A according to the present embodiment in a case where the change of the duty ratio of the electrode fingers 14 in the intermediate region 24C is set to the change of the duty ratio shown in graph 1101 of FIG. 11. In FIG. 18, graph 1402 indicates the characteristics of the elastic wave resonator in the elastic wave resonator 4F according to the present variation in a case where the change of the duty ratio of the electrode fingers 14 in the intermediate region 24C is set to the change of the duty ratio shown in graph 1301 of FIG. 13.

When graph 1401 and graph 1402 in FIG. 18 are compared with each other, the strength of the spurious signal near a frequency of 6000 MHz is reduced in graph 1402. This is because the region in the intermediate region 24C where the electrode finger 14 having a duty ratio at which the strength of the spurious signal of the electrode finger 14 increases is formed, becomes small in the elastic wave resonator 4F as compared with the elastic wave resonator 4A.

In FIG. 18, graph 1403 indicates the characteristics of the elastic wave resonator in the elastic wave resonator 4F according to the present variation in a case where the change in the duty ratio of the electrode finger 14 in the intermediate region 24C is changed from the change in graph 1301 in FIG. 13. When graph 1401 and graph 1403 in FIG. 18 are compared with each other, the balance of the strength of the spurious signal near a frequency of 5250 MHz and near a frequency of 6000 MHz is changed. As described above, in the elastic wave resonator 4F according to the present variation, the balance of the strength of the spurious signal can be designed by adjusting the change amount of the duty ratio of the electrode fingers 14 in the intermediate region 24C.

In FIG. 18, graph 1404 indicates the characteristics of the elastic wave resonator in the elastic wave resonator 4F according to the present variation in a case where the change in the duty ratio of the electrode fingers 14 in the intermediate region 24C is set to the change in graph 1302 in FIG. 13. In graph 1404 of FIG. 18, as compared with graph 1401, the strength of the spurious signal is reduced both near a frequency of 5250 MHz and near a frequency of 6000 MHz.

In the elastic wave resonator 4F according to the present variation, the region where the electrode fingers 14 having a duty ratio at which the strength of the spurious signal increases is formed, can be reduced. In this way, in the elastic wave resonator 4F according to the present variation, the design of the electrode fingers 14 to further reduce the strength of the generated spurious signal may be carried out with more ease.

Third Embodiment

Difference in Electrode Finger Thickness

Figure 19:
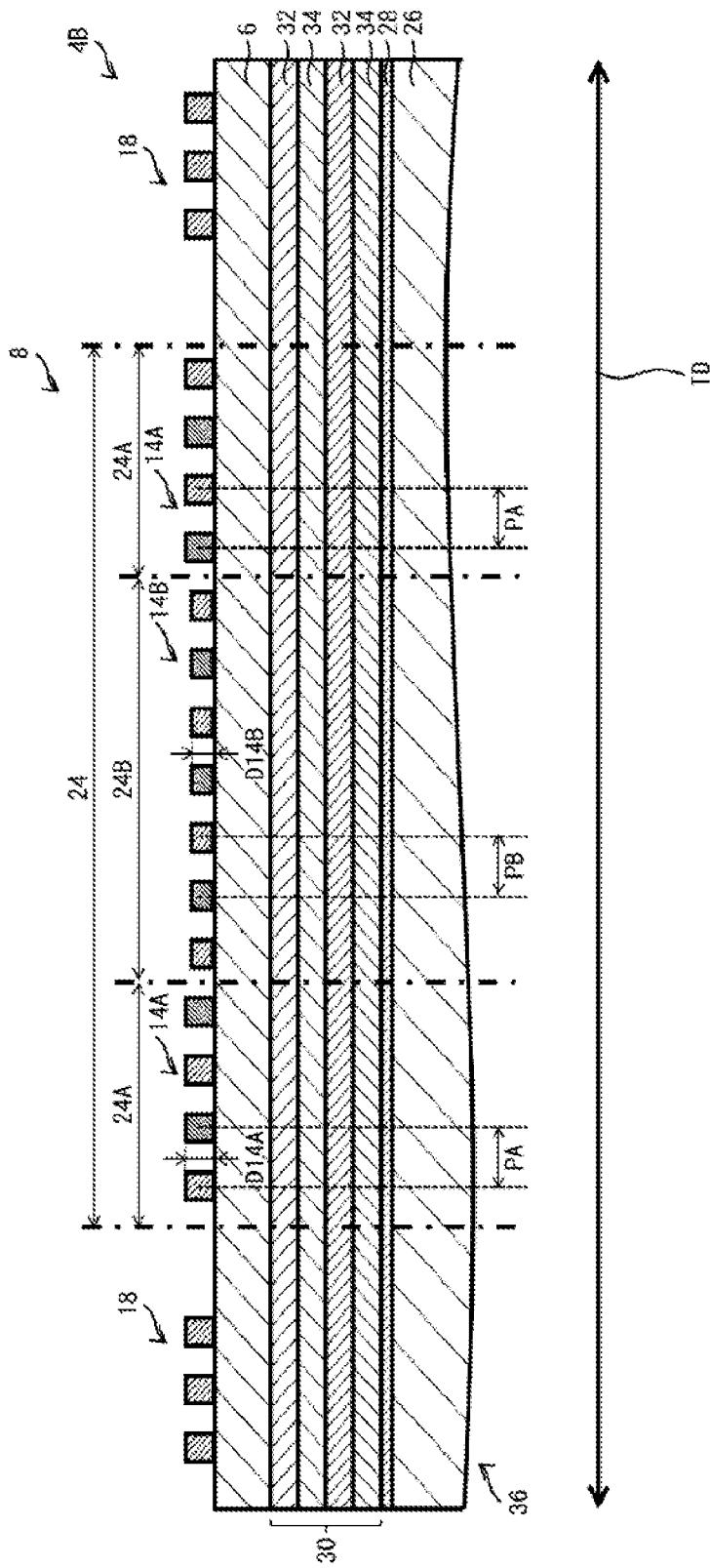
FIG. 19 is a schematic cross-sectional view of an elastic wave resonator according to a third embodiment of the present disclosure.

FIG. 19 is a schematic cross-sectional view of an elastic wave resonator 4B according to the present embodiment at a position corresponding to the cross section of the elastic wave resonator 4 illustrated in FIG. 2. The elastic wave resonator 4B according to the present embodiment differs in the configuration from the elastic wave resonator 4 according to the first embodiment only in a point that the thickness of the electrode fingers 14, in place of the duty ratio of the electrode fingers 14, is different between the first region 24A and the second region 24B.

In the present embodiment, as illustrated in FIG. 19, the first electrode finger group 14A located in the first region 24A has a first thickness D14A, and the second electrode finger group 14B located in the second region 24B has a second thickness D14B. In particular, in the present embodiment, when a first pitch PA is smaller than a second pitch PB, the first thickness D14A is thicker than the second thickness D14B.

Figure 20:
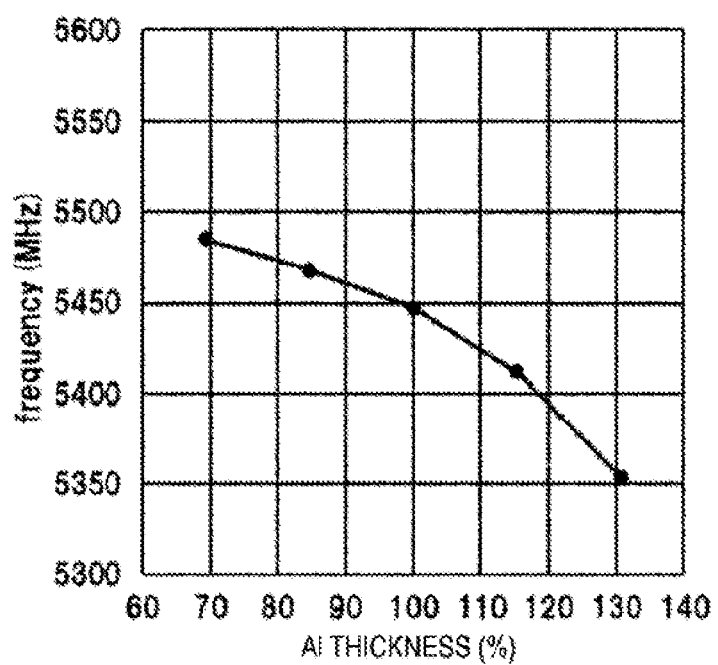
FIG. 20 is a graph indicating a relationship between a thickness of electrode fingers and a resonant frequency of an elastic wave resonator according to the third embodiment of the present disclosure.

FIG. 20 is a graph indicating a relationship between the thickness D14 of the electrode finger 14 and a resonant frequency of the elastic wave resonator 4B according to the present embodiment. In this case, the resonant frequency of the elastic wave oscillating in the main resonance mode was calculated by simulation and the calculated value was plotted on the graph in FIG. 20 in the case where the thickness D14 of a certain electrode finger 14 was taken as 100% and the thickness D14 of the electrode finger 14 was changed. In the graph of FIG. 20, the vertical axis represents frequency (units: MHz), and the horizontal axis represents, as a percent, the rate of thickness of A1, which is a material of the electrode finger 14.

As is apparent from FIG. 20, the thinner the thickness D14 of the electrode finger 14 is, the higher the resonant frequency of the elastic wave oscillating in the main resonance mode tends to be.

In the present embodiment, the first pitch PA is smaller than the second pitch PB, and the first thickness D14A is thicker than the second thickness D14B. Thus, the difference between the first thickness D14A and the second thickness D14B acts in a direction to cancel out a difference in height of the resonant frequencies caused by the difference between the first pitch PA and the second pitch PB. In other words, in the present embodiment, the resonant frequency effective-characteristics acting in a direction to cancel out the effects on a higher resonant frequency and a lower resonant frequency brought about by the magnitude correlation between the pitches of the first electrode finger group 14A and the second electrode finger group 14B refer to a difference in thickness between the first electrode finger group 14A and the second electrode finger group 14B.

With respect to the change of the thickness and pitch of the electrode fingers, the frequency of the elastic wave excited in the spurious mode has a dependence different from the dependence of the frequency of the elastic wave excited in a main resonance mode and antiresonance mode. Therefore, as in the elastic wave resonators 4 and 4A according to the above-described embodiments, also in the elastic wave resonator 4B according to the present embodiment, the strength of a spurious signal may be reduced while maintaining the uniformity of the resonant frequency.

In the elastic wave resonator 4B according to the present embodiment, the electrode finger placement region 24 includes the first region 24A and the second region 24B, but the embodiment is not limited thereto. For example, similar to the previous embodiment, the electrode finger placement region 24 may further include the intermediate region 24C between the first region 24A and the second region 24B in a plan view. In this case, the thickness of the intermediate electrode finger group 14C located in the intermediate region 24C may gradually change from the first region 24A side toward the second region 24B side.

Fourth Embodiment

Difference in Thickness of Piezoelectric Body

Figure 21:
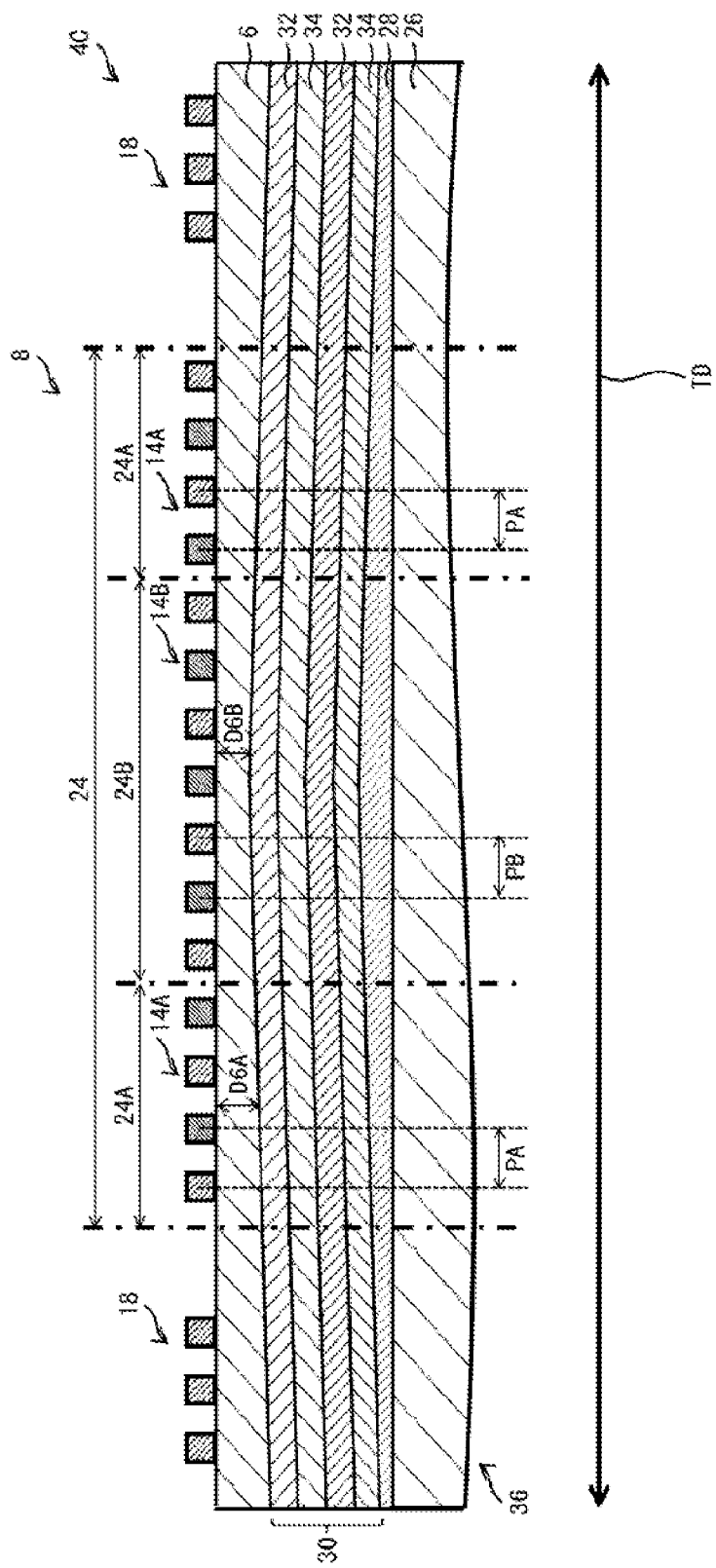
FIG. 21 is a schematic cross-sectional view of an elastic wave resonator according to a fourth embodiment of the present disclosure.

FIG. 21 is a schematic cross-sectional view of an elastic wave resonator 4C according to the present embodiment at a position corresponding to the cross section of the elastic wave resonator 4 illustrated in FIG. 2. The elastic wave resonator 4C according to the present embodiment differs in configuration from the elastic wave resonator 4 according to the first embodiment only in that the thickness of the piezoelectric body 6, in place of the duty ratio of the electrode fingers 14, differs between the first region 24A and the second region 24B.

In the present embodiment, as illustrated in FIG. 21, the piezoelectric body 6 has different thicknesses in the first region 24A and the second region 24B. In particular, in the present embodiment, the piezoelectric body 6 is gradually reduced in thickness from an end portion toward the center of the piezoelectric body 6 in the propagation direction TD.

As illustrated in FIG. 21, for example, the piezoelectric body 6 has a first thickness D6A in the first region 24A, and has a second thickness D6B in the second region 24B. In particular, in the present embodiment, when a first pitch PA is smaller than a second pitch PB, the first thickness D6A is thicker than the second thickness D6B.

Herein, each of the first thickness D6A and the second thickness D6B may have a different thickness depending on the position in each of the first region 24A and the second region 24B. For example, each of the first thickness D6A and the second thickness D6B gradually decreases in thickness from the end portion side toward the center side of the piezoelectric body 6 in the propagation direction TD.

The thickness of the cohesion layer 28 may change in accordance with the change in the thickness of the piezoelectric body 6, and thus the overall thickness of the fixation substrate 36 may be kept substantially constant. In the present embodiment, the cohesion layer 28 may gradually increase in thickness from an end portion toward the center of the cohesion layer 28 in the propagation direction TD, for example.

Figure 22:
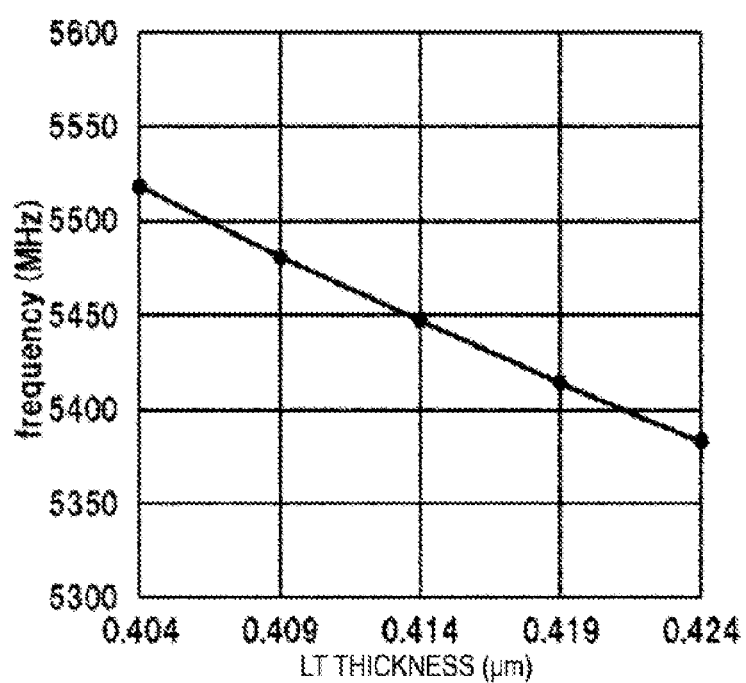
FIG. 22 is a graph indicating a relationship between a thickness of a piezoelectric body and a resonant frequency of an elastic wave resonator according to the fourth embodiment of the present disclosure.

FIG. 22 is a graph indicating a relationship between the thickness D6 of the piezoelectric body 6 and a resonant frequency of the elastic wave resonator 4C according to the present embodiment. In the graph of FIG. 22, the vertical axis represents frequency (units: MHz), and the horizontal axis represents the thickness of the piezoelectric body 6 in units of μm. As is apparent from FIG. 22, the thinner the thickness D6 of the piezoelectric body 6 is, the higher the resonant frequency of the elastic wave oscillating in the main resonance mode tends to be.

In the present embodiment, the first pitch PA is smaller than the second pitch PB, and the first thickness D6A is thicker than the second thickness D6B. Thus, the difference between the first thickness D6A and the second thickness D6B acts in a direction to cancel out a difference in height of the resonant frequencies caused by the difference between the first pitch PA and the second pitch PB. In other words, in the present embodiment, the resonant frequency effective characteristics acting in a direction to cancel out the effects on a higher resonant frequency and a lower resonant frequency brought about by the magnitude correlation between the pitches of the first electrode finger group 14A and the second electrode finger group 14B refer to a difference in thickness of the piezoelectric body 6.

With respect to the changes in the pitch of the electrode fingers and the thickness of the piezoelectric body, the frequency of the elastic wave excited in the spurious mode has a dependence different from the dependence of the frequency of the elastic wave excited in a main resonance mode and antiresonance mode. Therefore, as in the elastic wave resonators 4, 4A, and 4B according to the above-described embodiments, also in the elastic wave resonator 4C according to the present embodiment, the strength of the spurious signal may be reduced while maintaining the uniformity of the resonant frequency.

In the elastic wave resonator 4C according to the present embodiment, the electrode finger placement region 24 includes the first region 24A and the second region 24B, but the embodiment is not limited thereto. For example, similar to the second embodiment, the electrode finger placement region 24 may further include the intermediate region 24C between the first region 24A and the second region 24B in a plan view.

In the present embodiment, the thickness of the piezoelectric body 6 gradually changes from an end portion toward the center of the piezoelectric body 6 in the propagation direction TD, but the embodiment is not limited thereto. For example, the thickness of the piezoelectric body 6 may vary discontinuously at a boundary between the first region 24A and the second region 24B.

Fifth Embodiment

Difference in Thickness of Reflective Multilayer Film

Figure 23:
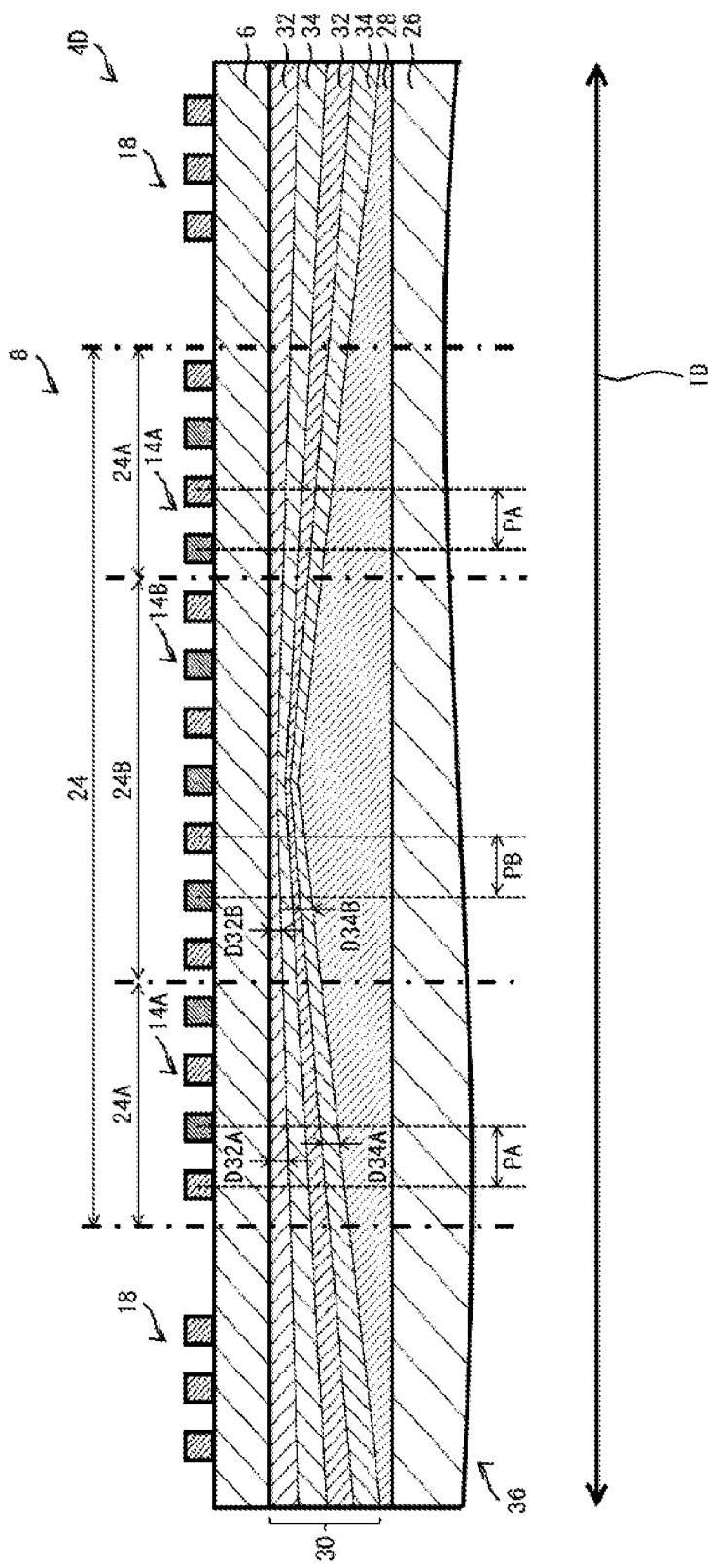
FIG. 23 is a schematic cross-sectional view of an elastic wave resonator according to a fifth embodiment of the present disclosure.

FIG. 23 is a schematic cross-sectional view of an elastic wave resonator 4D according to the present embodiment at a position corresponding to the cross section of the elastic wave resonator 4 illustrated in FIG. 2. The elastic wave resonator 4D according to the present embodiment differs in configuration from the elastic wave resonator 4 according to the first embodiment only in that the thickness of the reflective multilayer film 30, in place of the duty ratio of the electrode fingers 14, is different between the first region 24A and the second region 24B.

In the present embodiment, as illustrated in FIG. 23, the reflective multilayer film 30 has different thicknesses in the first region 24A and the second region 24B. In particular, in the present embodiment, the reflective multilayer film 30 is gradually decreased in thickness from an end portion toward the center of the reflective multilayer film 30 in the propagation direction TD. In particular, in the present embodiment, the change in thickness of the reflective multilayer film 30 is achieved by the thickness of each of the first layer 32 and the second layer 34 gradually decreasing from the end portion toward the center of the reflective multilayer film 30.

As illustrated in FIG. 23, for example, the first layer 32 has a first thickness D32A in the first region 24A, and has a second thickness D32B in the second region 24B. In particular, in the present embodiment, when a first pitch PA is smaller than a second pitch PB, the first thickness D32A is thicker than the second thickness D32B. Likewise, as illustrated in FIG. 23, for example, the second layer 34 has a first thickness D34A in the first region 24A, and has a second thickness D34B in the second region 24B. In particular, in the present embodiment, when the first pitch PA is smaller than the second pitch PB, the first thickness D34A is thicker than the second thickness D34B.

The first thickness D32A, the second thickness D32B, the first thickness D34A, and the second thickness D34B may each have a different thickness depending on a position in each of the first region 24A and the second region 24B. For example, each of the first thickness D32A, second thickness D32B, first thickness D34A, and second thickness D34B gradually decreases in thickness from the end portion side toward the center side of the reflective multilayer film 30 in the propagation direction TD.

The thickness of a cohesion layer 28 may change in accordance with the change in thickness of the reflective multilayer film 30, and thus the overall thickness of the fixation substrate 36 may be kept substantially constant. In the present embodiment, the cohesion layer 28 may gradually increase in thickness from an end portion toward the center of the cohesion layer 28 in the propagation direction TD, for example.

Figure 24:
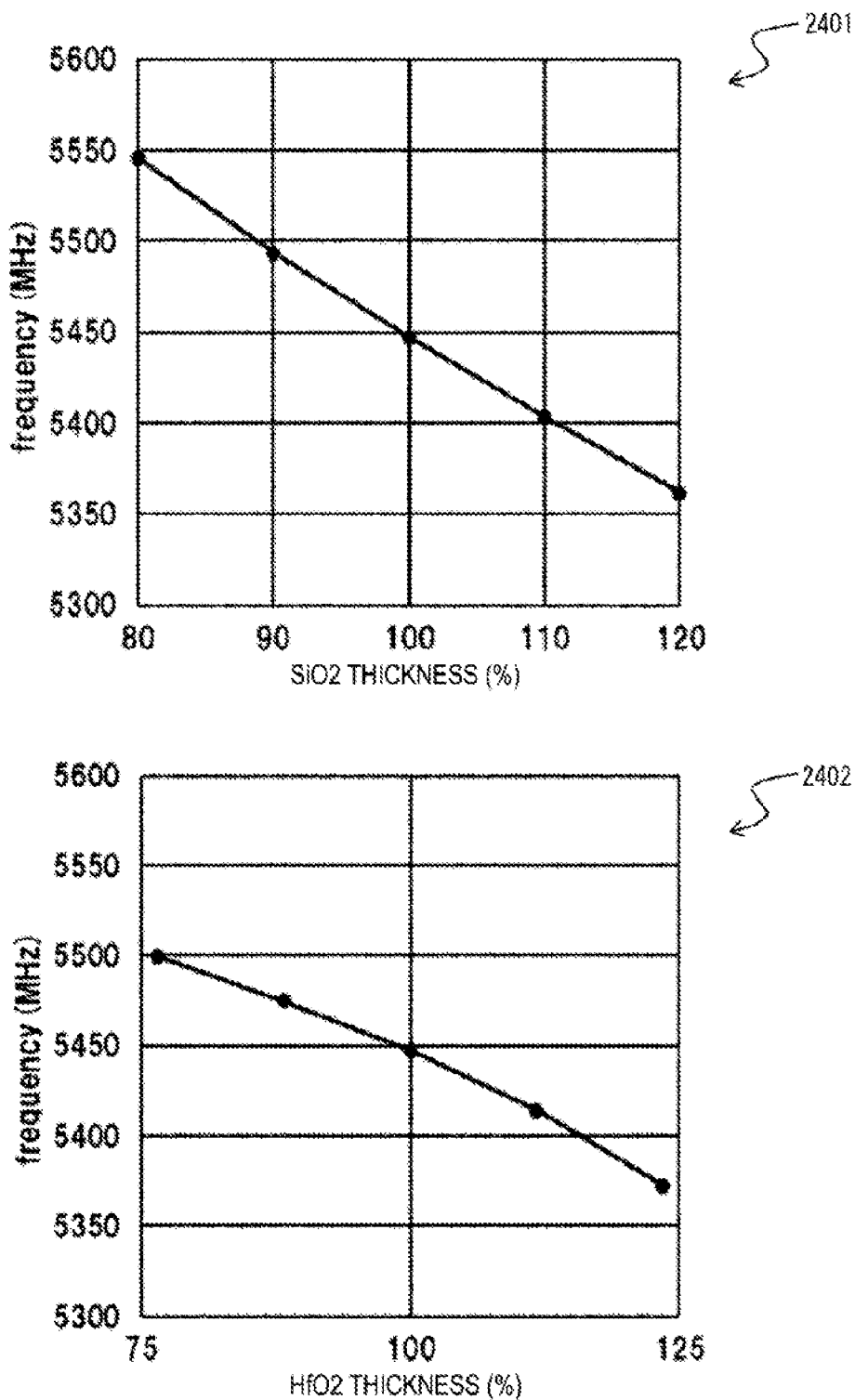
FIG. 24 includes graphs each indicating a relationship between a thickness of a multilayer film and a resonant frequency of an elastic wave resonator according to the fifth embodiment of the present disclosure.

FIG. 24 includes graphs each indicating a relationship between the thickness of the reflective multilayer film 30 and the resonant frequency of the elastic wave resonator 4D according to the present embodiment. The resonant frequency of the elastic wave oscillating in a main resonance mode was calculated by simulation and the calculated value was plotted on graph 2401 in FIG. 24 in the case where a thickness D32 of a certain first layer 32 was taken as 100% and the thickness D32 of the first layer 32 was changed. The resonant frequency of the elastic wave oscillating in the main resonance mode was calculated by simulation and the calculated value was plotted on graph 2402 in FIG. 23 in the case where a thickness D34 of a certain second layer 34 was taken as 100% and the thickness D34 of the second layer 34 was changed.

In graph 2401 of FIG. 24, the vertical axis represents frequency (units: MHz), and the horizontal axis represents, as a percentage, the proportion of the thickness of $SiO_2$, which is a material of the first layer 32. In graph 2402 of FIG. 24, the vertical axis represents frequency (units: MHz), and the horizontal axis represents, as a percentage, the proportion of the thickness of $HfO_2$, which is a material of the second layer 34.

As is apparent from FIG. 24, the thinner the thickness D32 of the first layer 32 and the thickness D34 of the second layer 34 are, the higher the resonant frequency of the elastic wave oscillating in the main resonance mode tends to be. In other words, the thinner the thickness of the reflective multilayer film 30 is, the higher the resonant frequency of the elastic wave oscillating in the main resonance mode tends to be.

In the present embodiment, the first pitch PA is smaller than the second pitch PB, and the first thickness D32A and first thickness D34A are thicker than the second thickness D32B and second thickness D34B, respectively. Due to this, the difference between the first thickness D32A and the second thickness D32B and the difference between the first thickness D34A and the second thickness D34B act in a direction to cancel out a difference in height of the resonant frequencies caused by the difference between the first pitch PA and the second pitch PB. In other words, in the present embodiment, the resonant frequency effective characteristics acting in a direction to cancel out the effects on a higher resonant frequency and a lower resonant frequency brought about by the magnitude correlation between the pitches of a first electrode finger group 14A and the second electrode finger group 14B, refer to a difference in thickness of the reflective multilayer film 30.

With respect to the changes of the pitch of the electrode fingers and the thickness of the reflective multilayer film, the frequency of the elastic wave excited in the spurious mode has a dependence different from the dependence of the frequency of the elastic wave excited in the main resonance mode and antiresonance mode. Therefore, as in the elastic wave resonators 4 and 4A to 4C according to the above-described embodiments, also in the elastic wave resonator 4D according to the present embodiment, the strength of a spurious signal may be reduced while maintaining the uniformity of the resonant frequency.

In the elastic wave resonator 4D according to the present embodiment, the electrode finger placement region 24 includes the first region 24A and the second region 24B, but the embodiment is not limited thereto. For example, similar to the second embodiment, the electrode finger placement region 24 may further include the intermediate region 24C between the first region 24A and the second region 24B in a plan view.

In the present embodiment, the thickness of the reflective multilayer film 30 gradually changes from an end portion toward the center of the reflective multilayer film 30 in the propagation direction TD, but the embodiment is not limited thereto. For example, the thickness of the reflective multilayer film 30 may vary discontinuously at a boundary between the first region 24A and the second region 24B.

Sixth Embodiment

Protective Film

Figure 25:
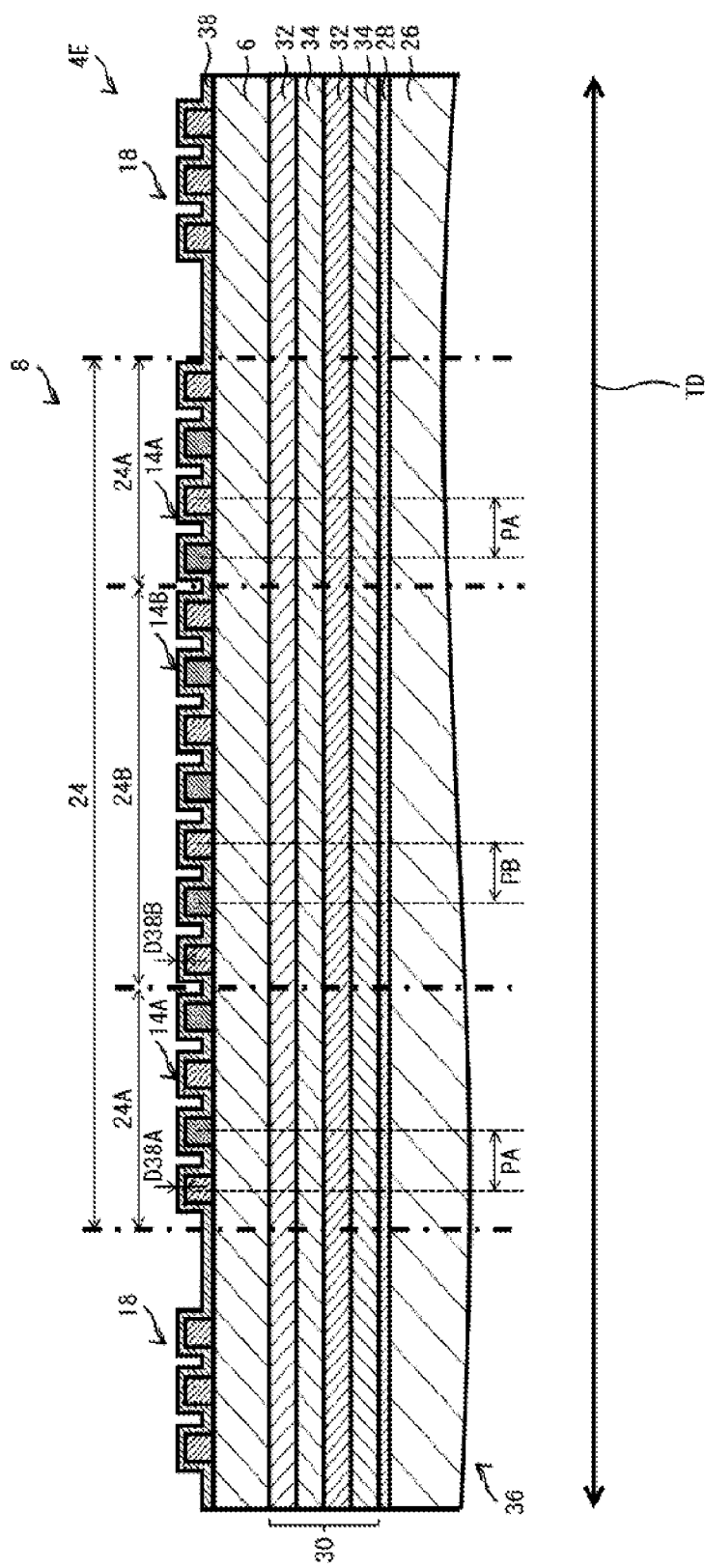
FIG. 25 is a schematic cross-sectional view of an elastic wave resonator according to a sixth embodiment of the present disclosure.

FIG. 25 is a schematic cross-sectional view of an elastic wave resonator 4E according to the present embodiment at a position corresponding to the cross section of the elastic wave resonator 4 illustrated in FIG. 2. As illustrated in FIG. 25, the elastic wave resonator 4E according to the present embodiment includes a protective film 38 at a position covering the uppermost surface of the elastic wave resonator 4E as compared to the elastic wave resonator 4 according to the first embodiment. In other words, the elastic wave resonator 4E according to the present embodiment includes the protective film 38 at a position covering the upper surface of the piezoelectric body 6 and at a position covering the upper surface and the side surface of each of the IDT electrode 8 and the reflector 18.

The protective film 38 is a thin film used for protecting the electrodes on the piezoelectric body 6, such as suppressing corrosion of the IDT electrode 8 and the reflector 18. For example, $SiO_2$, $Si_3N_4$ or the like may be used for the protective film 38. The protective film 38 may include a plurality of laminated layers each made of the above-described material. The materials described above are suitable for the protective film 38 because of high insulation and low mass. However, the material of the protective film 38 is not limited thereto.

In the present embodiment, as illustrated in FIG. 25, the protective film 38 has different thicknesses in the first region 24A and the second region 24B. In the present embodiment, the duty ratio of electrode fingers 14 of the IDT electrode 8 is constant instead. In the present embodiment, the protective film 38 may gradually decrease in thickness from an end portion toward the center of the protective film 38 in the propagation direction TD, or may vary discontinuously at a boundary between the first region 24A and the second region 24B.

Figure 26:
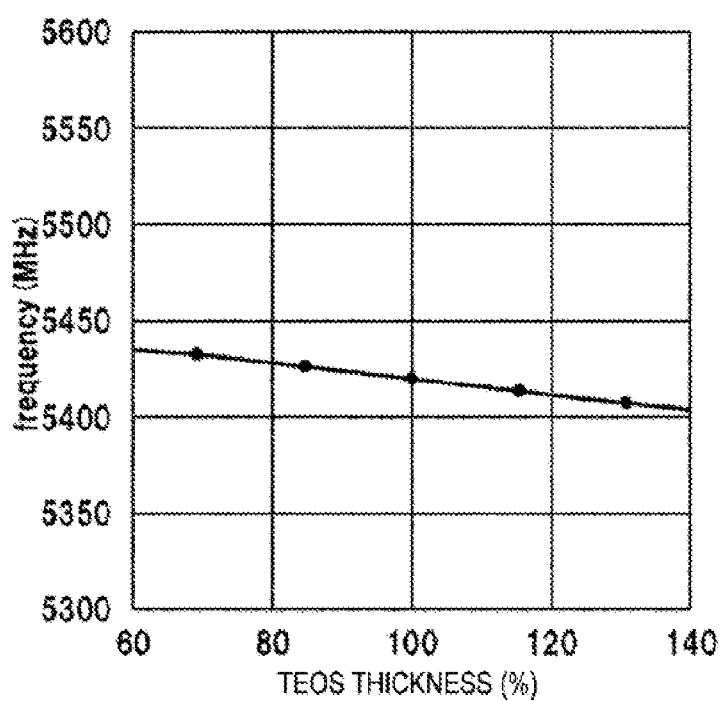
FIG. 26 is a graph indicating a relationship between a thickness of a protective layer and a resonant frequency of an elastic wave resonator according to the sixth embodiment of the present disclosure.

As illustrated in FIG. 26, for example, the protective film 38 has a first thickness D38A in the first region 24A, and has a second thickness D38B in the second region 24B. In particular, in the present embodiment, when a first pitch PA is smaller than a second pitch PB, the first thickness D38A is thicker than the second thickness D38B.

Except for the above-described points, the configuration of the elastic wave resonator 4E according to the present embodiment may be identical to the configuration of the elastic wave resonator 4 according to the first embodiment.

FIG. 26 is a graph indicating a relationship between the thickness of the protective film 38 and the resonant frequency of the elastic wave resonator 4E according to the present embodiment. Herein, the resonant frequency of the elastic wave oscillating in a main resonance mode was calculated by simulation and the calculated value was plotted on the graph in FIG. 26 in the case where the thickness of a certain protective film 38 was taken as 100% and the thickness of the protective film 38 was changed. In the graph of FIG. 26, the vertical axis represents frequency (units: MHz), and the horizontal axis represents the proportion of the thickness of the protective film 38 as a percentage.

As is apparent from FIG. 26, the thinner the thickness of the protective film 38 is, the higher the resonant frequency of the elastic wave oscillating in the main resonance mode tends to be.

In the present embodiment, the first pitch PA is smaller than the second pitch PB, and the first thickness D38A is thicker than the second thickness D38B. Thus, the difference between the first thickness D38A and the second thickness D38B acts in a direction to cancel out a difference in height of the resonant frequencies caused by the difference between the first pitch PA and the second pitch PB. In other words, in the present embodiment, the resonant frequency effective-characteristics acting in a direction to cancel out the effects on a higher resonant frequency and a lower resonant frequency brought about by the magnitude correlation between the pitches of the first electrode finger group 14A and the second electrode finger group 14B, refer to a difference in thickness of the protective film 38.

With respect to the changes of the pitch of the electrode fingers and the thickness of the piezoelectric body, the frequency of the elastic wave excited in the spurious mode has a dependence different from the dependence of the frequency of the elastic wave excited in the main resonance mode and antiresonance mode. Therefore, as in the elastic wave resonators 4 and 4A to 4D according to the above-described embodiments, also in the elastic wave resonator 4E according to the present embodiment, the strength of a spurious signal may be reduced while maintaining the uniformity of the resonant frequency.

In the elastic wave resonator 4E according to the present embodiment, the electrode finger placement region 24 includes the first region 24A and the second region 24B, but the embodiment is not limited thereto. For example, similar to the second embodiment, the electrode finger placement region 24 may further include the intermediate region 24C between the first region 24A and the second region 24B in a plan view. In this case, the thickness of the protective film 38 is preferably gradually changed from an end portion toward the center of the protective film 38 in the propagation direction TD.

A thin film formed at a position covering the uppermost surface of the elastic wave resonator 4E, such as the protective film 38 according to the present embodiment, may be included also in the elastic wave resonators 4 and 4A to 4D according to the above-described embodiments. However, in the case where the elastic wave resonators 4 and 4A to 4D according to the above-described embodiments include the above-described thin film, the thin film may have an in-plane thickness distribution, or may be formed substantially uniform in thickness.

Seventh Embodiment

Strip Electrode Pitch of Reflector

Figure 27:
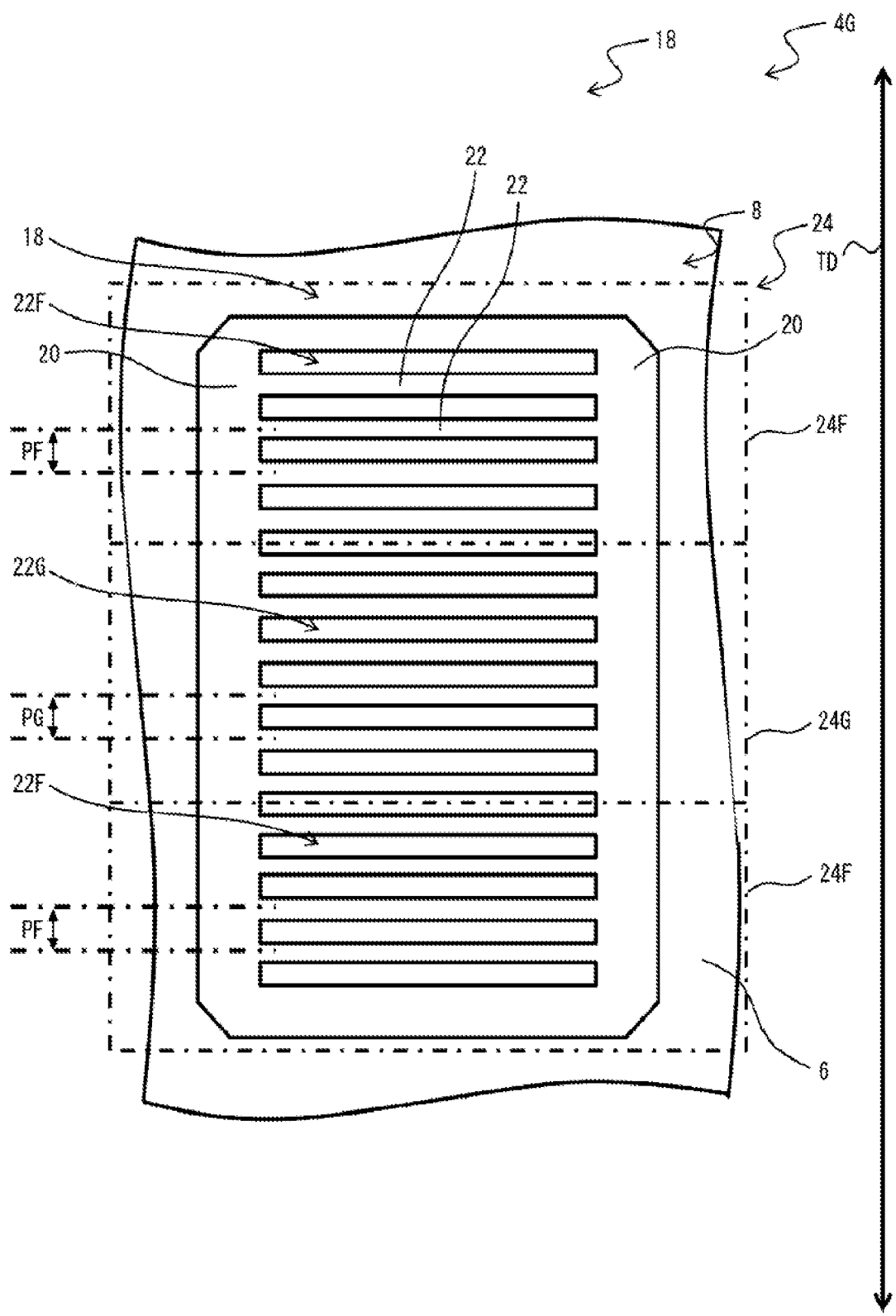
FIG. 27 is a schematic plan view of an elastic wave resonator according to a seventh embodiment of the present disclosure in which the vicinity of a reflector is enlarged and illustrated.

FIG. 27 is a schematic plan view of an elastic wave resonator 4G according to the present embodiment in which the periphery of the reflector 18 is enlarged and illustrated. The elastic wave resonator 4G according to the present embodiment may have an identical configuration to the elastic wave resonators according to the above-described embodiments except for the configuration of the reflector 18, for example. The number of strip electrodes 22 in the reflector 18 illustrated in FIG. 27 is different from the number of strip electrodes 22 in the reflector 18 illustrated in FIG. 1 and the like. However, the elastic wave resonators according to the above-described embodiments may also include the reflector 18 provided with the same number of strip electrodes 22 as the reflector 18 illustrated in FIG. 27.

The elastic wave resonator 4G according to the present embodiment includes the electrode finger placement region 24 in a region including the strip electrodes 22 of the reflector 18, as illustrated in FIG. 27. In the present embodiment, the electrode finger placement region 24 includes at least one first region 24F and at least one second region 24G. The strip electrodes 22 include a first strip electrode group 22F serving as a first electrode finger group located in the first region 24F, and a second strip electrode group 22G serving as a second electrode finger group located in the second region 24B.

In the present embodiment, when the elastic wave resonator 4G includes a pair of reflectors 18, the electrode finger placement region 24 may be formed in each of the reflectors 18. The electrode finger placement region 24 may include at least one of the first region 24F or the second region 24G in a plural number. For example, as illustrated in FIG. 27, the electrode finger placement region 24 symmetrically includes the first regions 24F with respect to the second region 24G in the propagation direction TD.

The plurality of strip electrodes 22 are each arranged with a certain pitch therebetween, as in the electrode fingers 14. A first pitch PF of the first strip electrode group 22F is different from a second pitch PG of the second strip electrode group 22G.

The duty ratio of the first strip electrode group 22F is different from the duty ratio of the second strip electrode group 22G. In particular, the duty ratio of the first strip electrode group 22F and the duty ratio of the second strip electrode group 22G are designed to cancel out the effects on a higher resonant frequency and a lower resonant frequency brought about by a difference between the first pitch PF and the second pitch PG. Specifically, when the first pitch PF is smaller than the second pitch PG, the duty ratio of the first strip electrode group 22F is greater than the duty ratio of the second strip electrode group 22G.

Herein, also with respect to the changes in the duty ratio and the pitch of the strip electrodes of the reflector, the frequency of the elastic wave excited in the spurious mode has a dependence different from the dependence of the frequency of the elastic wave excited in a main resonance mode and antiresonance mode. Thus, the elastic wave resonator 4G includes the first strip electrode group 22F and the second strip electrode group 22G having mutually different pitches and duty ratios, and having a further reduced difference in the resonant frequency therebetween.

This makes it possible to cause the frequency of the elastic wave excited in the spurious mode to be more different between the first region 24F and the second region 24G, while further maintaining the uniformity of the frequency of the elastic wave excited in the main resonance mode. Thus, according to the present embodiment, the strength of a spurious signal can be reduced by scattering the frequency of the elastic wave excited in the spurious mode while maintaining the uniformity of the resonant frequency in the same elastic wave resonator 4G.

In the present embodiment as well, the thickness of the strip electrode 22, the piezoelectric body 6, the reflective multilayer film 30, or the protective film 38 may be different, in place of the duty ratio of the strip electrode 22, between the first region 24F and the second region 24G. In this case, the difference in thickness thereof is designed to cancel out the effects on a higher resonant frequency and a lower resonant frequency brought about by the difference between the first pitch PF and the second pitch PG.

Other Variations

In any of the above-described embodiments, a case in which the duty ratio of the electrode fingers, the thickness of the electrode fingers, the thickness of the piezoelectric body 6, the thickness of the reflective multilayer film 30, the thickness of the protective film 38, and the like are changed individually with respect to the pitch of the electrode fingers, is taken as an example and described. However, the present disclosure is not limited thereto, and the configurations of the elastic wave resonators 4 and 4A to 4G may also be combined with each other.

For example, as for a region where the pitch of the electrode fingers is larger than one region, the duty ratio of the electrode fingers in this region may be made small, and the thickness of the protective film 38 may be reduced. This makes it possible to achieve the same or similar effect while reducing the amount of adjustment of each of the elements in comparison with a case in which the resonant frequency is adjusted by a single element.

In each of the embodiments, an example is described in which the elastic wave resonators 4 and 4A to 4G each include both the first region and the second region in the region including the IDT electrode 8 and/or the region including the reflector 18. However, each of the embodiments is not limited thereto, and the first region may be formed only in a region including the IDT electrode 8, and the second region may be formed only in a region including the reflector 18.

In other words, in each of the embodiments, all of the electrode fingers 14 of the IDT electrode 8 may be included in a first electrode finger group, and all of the strip electrodes 22 of the reflector 18 may be included in a second electrode finger group. In this case, the pitches of the electrode finger 14 and the strip electrode 22 are different from each other, and the design to cancel out a difference in height of the resonant frequencies caused by the difference between the pitches of the electrode finger 14 and the strip electrode 22 is made. In the above-described case, the pitch may be constant in the electrode fingers 14 or in the strip electrodes 22.

In each of the embodiments, an example is described in which the elastic wave resonators 4 and 4A to 4G each include the reflective multilayer film 30. However, the present disclosure is not limited thereto, and the fixation substrate 36 of the elastic wave resonators 4 and 4A to 4G may have the piezoelectric body 6 formed directly on the support substrate 26 made of Si, or may include an insulation layer made of $SiO_2$ instead of the reflective multilayer film 30.

In addition, in the elastic wave resonators 4 and 4A to 4G according to each of the embodiments, a gap may be located between the back surface side of a region of the piezoelectric body 6 where the IDT electrode 8 is formed, and the support substrate 26. In this case, the elastic wave resonators 4 and 4A to 4G according to each of the embodiments may have a so-called membrane shape, in which the piezoelectric body 6 is disposed on the support substrate 26 including a recessed portion, for example.

An elastic wave resonator according to another aspect of the present disclosure includes a piezoelectric body, and an IDT electrode including a plurality of electrode fingers located on the piezoelectric body and arranged in a propagation direction of an elastic wave. A region in which the plurality of electrode fingers are located includes a first region and a second region in a plan view, the plurality of electrode fingers include a first electrode finger group located in the first region, and a second electrode finger group located in the second region, a pitch of the first electrode finger group is different from a pitch of the second electrode finger group, and the first region and the second region have frequency effective characteristics acting in a direction to cancel out effects on a higher resonant frequency and a lower resonant frequency brought about by a magnitude correlation between the pitches of the first and second electrode finger groups.

An elastic wave resonator according to another aspect of the present disclosure further includes, in the above-described aspect, a support substrate on a side opposite to the IDT electrode relative to the piezoelectric body, and a reflective multilayer film between the piezoelectric body and the support substrate. The frequency effective characteristics refer to a difference in the thickness of the reflective multilayer film in the first region and the second region.

An elastic wave resonator according to another aspect of the present disclosure further includes, in any of the above-described aspects, a pair of reflectors located at both ends in the propagation direction with respect to the plurality of electrode fingers on the piezoelectric body.

An elastic wave resonator according to another aspect of the present disclosure includes a piezoelectric body, and an IDT electrode including a plurality of electrode fingers located on the piezoelectric body and arranged in a propagation direction of an elastic wave. A region in which the plurality of electrode fingers are located includes a first region and a second region in a plan view. Among the plurality of electrode fingers, a pitch of a first electrode finger group located in the first region is smaller than a pitch of a second electrode finger group located in the second region, and a duty ratio of the first electrode finger group is larger than a duty ratio of the second electrode finger group.

General Configuration of Communication Apparatus and Demultiplexer

Figure 28:
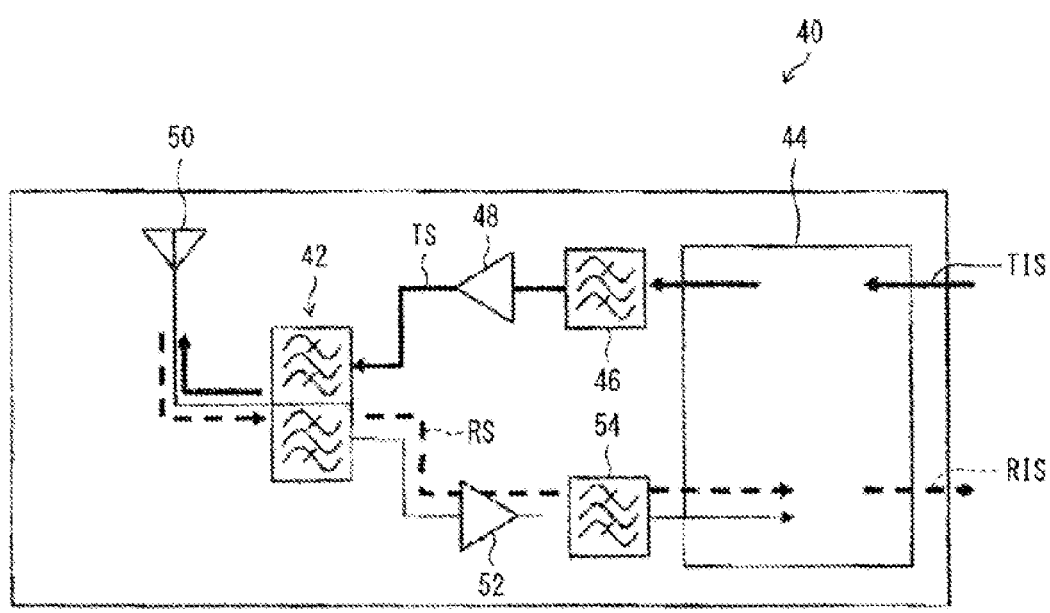
FIG. 28 is a schematic diagram illustrating a communication apparatus according to each of the embodiments of the present disclosure.

FIG. 28 is a block diagram illustrating a main portion of a communication apparatus 40 according to an embodiment of the present invention. The communication apparatus 40 performs wireless communication using radio waves. A demultiplexer 42 has a function of demultiplexing a signal of a transmission frequency and a signal of a reception frequency in the communication apparatus 40.

In the communication apparatus 40, a transmission information signal TIS including information to be transmitted is subjected to modulation and an increase in frequency (conversion to a high-frequency signal of a carrier wave frequency) by an RF-IC 44 to become a transmission signal TS. The transmission signal TS is subjected to removal of unwanted components, which are components other than the components in the passband for transmission, by a band-pass filter 46, and is amplified by an amplifier 48 to be input to the demultiplexer 42. The demultiplexer 42 removes unwanted components, which are components other than the components in the passband for transmission, from the input transmission signal TS, and then outputs the transmission signal TS to an antenna 50. The antenna 50 converts the input electrical signal (transmission signal TS) to a wireless signal and transmits the converted signal.

In the communication apparatus 40, a radio signal received by the antenna 50 is converted to an electrical signal (reception signal RS) by the antenna 50 to be input to the demultiplexer 42. The demultiplexer 42 removes unwanted components, which are components other than the components in the passband for reception, from the input reception signal RS, and then outputs the converted signal to an amplifier 52. The output reception signal RS is amplified by the amplifier 52, and is subjected to the removal of unwanted components, which are components other than the components in the passband for reception, by a band-pass filter 54. Then, the reception signal RS is subjected to a decrease in frequency and demodulation by the RF-IC 44 to become a reception information signal RIS.

The transmission information signal TIS and the reception information signal RIS may be a low-frequency signal (baseband signal) including appropriate information, and are, for example, an analog voice signal or a digitized voice signal. The passband of the wireless signal may be a passband in compliance with various standards such as Universal Mobile Telecommunications System (UMTS). The modulation scheme may be phase modulation, amplitude modulation, frequency modulation, or a combination of any two or more of these modulations.

Figure 29:
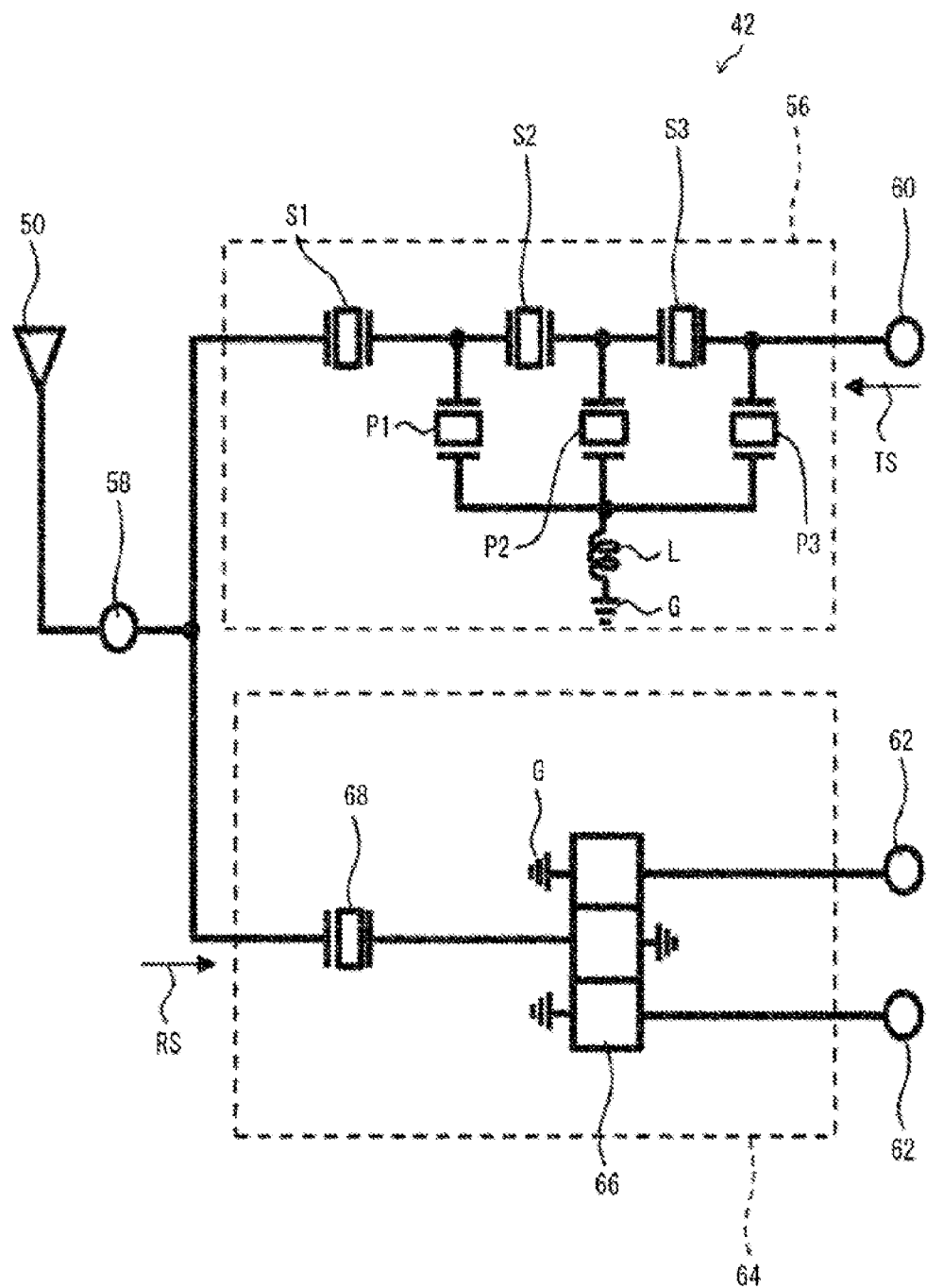
FIG. 29 is a circuit diagram describing a demultiplexer according to each of the embodiments of the present disclosure.

FIG. 29 is a circuit diagram illustrating a configuration of the demultiplexer 42 according to one embodiment of the present invention. The demultiplexer 42 refers to the demultiplexer 42 used in the communication apparatus 40 in FIG. 28.

A transmission filter 56 includes series resonators S1 to S3 and parallel resonators P1 to P3, as illustrated in FIG. 29. The demultiplexer 42 is mainly constituted of an antenna terminal 58, a transmission terminal 60, a reception terminal 62, the transmission filter 56 disposed between the antenna terminal 58 and the transmission terminal 60, and a reception filter 64 disposed between the antenna terminal 58 and the reception terminal 62. The transmission signal TS from the amplifier 48 is input to the transmission terminal 60, and the transmission signal TS input to the transmission terminal 60 is subjected to the removal of unwanted components, which are components other than the components in the passband for transmission, in the transmission filter 56 and is output to the antenna terminal 58. The reception signal RS from the antenna 50 is input to the antenna terminal 58, and is subjected to the removal of unwanted components, which are components other than the components in the passband for reception, in the reception filter 64 and is output to the reception terminal 62.

The transmission filter 56 is constituted by, for example, a ladder elastic wave filter. Specifically, the transmission filter 56 includes three series resonators S1, S2, and S3 connected in series between the input side and the output side of the filter, and three parallel resonators P1, P2, and P3 provided between series arms which are wires for connecting the series resonators to one another, and a reference potential portion G. That is, the transmission filter 56 is a three-stage ladder filter. However, the number of stages of the ladder filter in the transmission filter 56 is optional.

An inductor L is provided between the parallel resonators P1 to P3 and the reference potential portion G. By setting the inductance of the inductor L to a predetermined magnitude, an attenuation pole is formed outside the passband of the transmission signal to increase out-of-band attenuation. A plurality of the series resonators S1 to S3 and a plurality of the parallel resonators P1 to P3 are each made of an elastic wave resonator.

The reception filter 64 includes, for example, a multi-mode elastic wave filter 66, and an auxiliary resonator 68 connected in series to the input side of the multi-mode elastic wave filter 66. In the present embodiment, the multi-mode includes a double mode. The multi-mode elastic wave filter 66 has a balanced-unbalanced conversion function, and the reception filter 64 is connected to two reception terminals 62, to which balanced signals are output. The reception filter 64 is not limited to being constituted by the multi-mode elastic wave filter 66, and may be constituted by a ladder filter, or may be a filter that does not have a balanced-unbalanced conversion function.

A circuit for impedance matching including an inductor or the like may be inserted between a connection point of the transmission filter 56, the reception filter 64 and the antenna terminal 58, and the ground potential portion G.

The elastic wave filter according to each of the embodiments described above is, for example, an elastic wave element constituting at least one ladder filter circuit of the transmission filter 56 and the reception filter 64 in the demultiplexer 42 illustrated in FIG. 28, for example. When any of the transmission filter 56 and the reception filter 64 is the elastic wave filter according to each of the embodiments described above, all or at least part of the elastic wave resonators included in the filter are the elastic wave resonator 4 and 4A to 4G according to each of the above-described embodiments.

By adopting the demultiplexer 42 including the transmission filter 56 or the reception filter 64 described above, the filter characteristics of the communication apparatus 40 may be improved.

The present invention is not limited to each of the embodiments described above, and various modifications can be made within the scope of the claims, and further embodiments obtained by appropriately combining technical means disclosed in different embodiments are included in the technical scope of the present invention.

REFERENCE SIGNS LIST

2 Elastic wave filter
4, 4A-4G Elastic wave resonator
6 Piezoelectric body
8 IDT electrode
12, 20 Bus bar
14 Electrode finger
14A First electrode finger group
14B Second electrode finger group
14C Intermediate electrode finger group
14D First intermediate electrode finger group
14E Second intermediate electrode finger group
18 Reflector
22 Strip electrode
24 Electrode finger placement region
24A First region
24B Second region
24C Intermediate region
24D First intermediate region
24D Second intermediate region
26 Support substrate
30 Reflective multilayer film
38 Protective film
40 Communication apparatus
42 Demultiplexer
44 RF-IC
50 Antenna
56 Transmission filter
58 Antenna terminal
64 Reception filter

The invention claimed is:
1. An elastic wave resonator, comprising:
a piezoelectric member comprising a first surface that includes a first region and a second region; and
a plurality of electrode fingers:
  located on the piezoelectric member;
  being on a line in a first direction; and
  comprising:
    first electrode fingers in the first region, comprising a first pitch between each two of the first electrode fingers; and
    second electrode fingers in the second region, comprising a second pitch between each two of the second electrode fingers, the second pitch different from the first pitch,
wherein a first resonant frequency of a first main resonance of a first elastic wave generated in the first region is identical to a second resonant frequency of a second main resonance of a second elastic wave generated in the second region.

2. The elastic wave resonator according to claim 1, wherein
a first duty ratio of the first electrode fingers is different from a second duty ratio of the second electrode fingers.

3. The elastic wave resonator according to claim 1, wherein
a first thickness of the first electrode fingers is different from a second thickness of the second electric fingers.

4. The elastic wave resonator according to claim 1, wherein
a first thickness of the piezoelectric member in the first region is different from a second thickness of the piezoelectric member in the second region.

5. The elastic wave resonator according to claim 1, further comprising:
a second surface opposite to the first surface of the piezoelectric member;
a reflective multilayer film on the second surface, having:
a first thickness in the first region; and
a second thickness in the second region, the second thickness different from the first thickness; and
a support substrate on the reflective multilayer film.

6. The elastic wave resonator according to claim 1, further comprising:
a protective film comprising an insulation material, located on the plurality of electrode fingers, and having:
a first thickness in the first region; and
a second thickness in the second region, the second thickness different from the first thickness.

7. The elastic wave resonator according to claim 1, wherein
the first surface further comprises a third region, the third region identical to the first region in structure with respect to the second region in the first direction.

8. The elastic wave resonator according to claim 1, further comprising:
an IDT electrode comprising one part of the plurality of electrode fingers; and
a pair of reflectors located at both ends in the first direction with respect to the IDT electrode and each comprising another part of the plurality of electrode fingers.

9. The elastic wave resonator according to claim 1, wherein
a resonant frequency of an elastic wave in a region of 80% or more of a region where the plurality of electrode fingers are located is identical to the first resonant frequency.

10. The elastic wave resonator according to claim 1, wherein
a thickness of the piezoelectric member is equal to or less than the first pitch or the second pitch.

11. An elastic wave filter, comprising:
at least one elastic wave resonator according to claim 1.

12. A demultiplexer, comprising:
an antenna terminal;
a transmission filter configured to perform filtering on a transmission signal and output the transmission signal to the antenna terminal; and
a reception filter configured to perform filtering on a reception signal from the antenna terminal, wherein
the transmission filter and/or the reception filter comprises the elastic wave filter according to claim 11.

13. A communication apparatus, comprising:
an antenna;
the demultiplexer according to claim 12 with the antenna terminal connected to the antenna; and
an IC connected to the transmission filter and the reception filter.

14. An elastic wave resonator, comprising:
a piezoelectric member comprising a first surface that includes a first region, a second region and a third region; and
a plurality of electrode fingers:
located on the piezoelectric member;
being on a line in a first direction; and
comprising:
first electrode fingers in the first region, comprising a first pitch between each two of the first electrode fingers;
second electrode fingers in the second region, comprising a second pitch between each two of the second electrode fingers, the second pitch different from the first pitch, and
third electrode fingers in the third region, comprising a third pitch between each two of the third electrode fingers, the third pitch between the first pitch and the second pitch in magnitude, wherein
a resonant frequency of a main resonance of an elastic wave in the third region is between a resonant frequency of a main resonance of an elastic wave in the first region and a resonant frequency of a main resonance of an elastic wave in the second region.

15. The elastic wave resonator according to claim 14, wherein the third region is between the first region and the second region, and the third pitch gradually changes from the first region toward the second region.

16. The elastic wave resonator according to claim 15, wherein the third region comprises:
a first intermediate region in which the third pitch gradually changes from the first region toward the second region based on a first change amount, and
a second intermediate region in which the third pitch gradually changes from the first region toward the second region based on a second change amount different from the first change amount.

17. The elastic wave resonator according to claim 14, wherein
a first duty ratio of the first electrode fingers is different from a second duty ratio of the second electrode fingers.

18. The elastic wave resonator according to claim 14, wherein
a first thickness of the piezoelectric member in the first region is different from a second thickness of the piezoelectric member in the second region.

* * * * *